(12) United States Patent
Scheele et al.

(10) Patent No.: US 7,955,133 B2
(45) Date of Patent: Jun. 7, 2011

(54) FLEXIBLE POWER DISTRIBUTION MODULE

(75) Inventors: Juergen Scheele, Wildeshausen (DE); Ronald Michael Rygiel, Schaumburg, IL (US); Julio Cesar Urrea, Chicago, IL (US); Kerri Michelle Hood, Schaumburg, IL (US); Timothy R. Goldsberry, Orland Hills, IL (US); Joseph Butler, Warren, MI (US); Edwin J. Harris, Oak Park, IL (US)

(73) Assignee: Littelfuse, Inc., Des Plaines, IL (US)

( * ) Notice: Subject to any disclaimer, the term of this patent is extended or adjusted under 35 U.S.C. 154(b) by 204 days.

(21) Appl. No.: 12/108,328

(22) Filed: Apr. 23, 2008

(65) Prior Publication Data

US 2009/0269951 A1 Oct. 29, 2009

(51) Int. Cl.
*H01R 13/68* (2011.01)
*H02B 1/26* (2006.01)

(52) U.S. Cl. .................. 439/620.27; 439/250; 439/76.2; 439/849; 361/626; 361/630; 361/633; 361/752

(58) Field of Classification Search .................. 361/622, 361/626, 630, 633, 752, 803; 439/250, 76.2, 439/849, 620.027
See application file for complete search history.

(56) References Cited

U.S. PATENT DOCUMENTS

| | | | |
|---|---|---|---|
| 827,106 A * | 7/1906 | Mathieu | ......................... 215/55 |
| 1,484,448 A | 2/1924 | Hart | |
| 1,513,691 A | 10/1924 | Bissell | |
| 1,522,729 A | 1/1925 | Loudon | |
| 1,529,773 A | 3/1925 | Crabbs | |
| 1,555,930 A | 10/1925 | Allen | |
| 1,631,178 A | 6/1927 | Wurdack | |
| 1,638,257 A | 8/1927 | Gunn | |
| 1,650,252 A | 11/1927 | Wilhelm | |
| 1,700,582 A | 1/1929 | Brown | |
| 1,714,790 A | 5/1929 | Kovar | |
| 1,715,799 A | 6/1929 | Taylor | |
| 1,721,098 A | 7/1929 | Wallis | |
| 1,732,265 A | 10/1929 | Fried | |
| 1,735,072 A | 11/1929 | Benjamin | |
| 1,805,725 A | 5/1931 | Sachs | |
| 1,817,521 A | 8/1931 | Messing | |
| 1,821,987 A | 9/1931 | Redshaw | |
| 1,832,796 A | 11/1931 | Straubing et al. | |
| 1,833,158 A | 11/1931 | Frank | |
| 1,851,471 A | 3/1932 | Wadsworth | |
| 1,856,423 A | 5/1932 | Olley | |
| 1,863,932 A | 6/1932 | Mogilner | |
| 1,880,543 A | 10/1932 | Wadsworth | |
| 1,888,854 A | 11/1932 | France et al. | |
| 1,917,861 A | 7/1933 | Wadsworth | |

(Continued)

*Primary Examiner* — Zachary M Pape
(74) *Attorney, Agent, or Firm* — Kacvinsky Daisak, PLLC

(57) ABSTRACT

A power distribution module for a vehicle includes an insulating housing including a component grid, the component grid defining a plurality of circuit protection footprints, the housing further including at least one connector mount or terminal mating location; a printed circuit board ("PCB") located within the housing and beneath the component grid, the PCB holding a plurality of fuse mounting terminals and at least one connector mounting terminal, the PCB including a plurality of conducting traces connecting the fuse mounting terminals to the at least one connector mounting terminal; and a cover that threadingly engages the housing, the threading engagement leading to a locking of the cover to the housing that tends to prevent the cover from loosening from the housing when the vehicle is being driven, the locking of the cover able to be overcome by a person so that the cover can be unthreaded readily from the housing.

13 Claims, 19 Drawing Sheets

U.S. PATENT DOCUMENTS

| | | |
|---|---|---|
| 1,917,862 A | 7/1933 | Wadsworth |
| 1,965,410 A | 7/1934 | Frank |
| 2,011,654 A | 8/1935 | Sandin |
| 2,086,727 A | 7/1937 | Morris |
| 2,145,154 A | 1/1939 | Corbett |
| 2,158,655 A | 5/1939 | Frank |
| 2,163,460 A | 6/1939 | Dahl |
| 2,239,660 A | 4/1941 | Shipley et al. |
| 2,264,260 A | 11/1941 | Schmitt et al. |
| 2,271,693 A | 2/1942 | House |
| 2,334,550 A | 11/1943 | Griffith |
| 2,524,004 A | 9/1950 | Wallace et al. |
| 2,851,671 A | 9/1958 | Luce |
| 3,268,692 A | 8/1966 | Oldham |
| 3,299,236 A | 1/1967 | Barker |
| 3,354,356 A | 11/1967 | Pettit et al. |
| 3,486,154 A | 12/1969 | Seagrave et al. |
| 3,704,438 A | 11/1972 | Boone |
| 3,796,978 A | 3/1974 | Grunert et al. |
| 3,967,164 A | 6/1976 | Valle |
| 3,993,395 A | 11/1976 | Taylor |
| 4,221,455 A | 9/1980 | Cairns et al. |
| 4,221,456 A | 9/1980 | Cairns et al. |
| 4,226,493 A | 10/1980 | Cairns et al. |
| 4,278,316 A | 7/1981 | White |
| 4,332,002 A | 5/1982 | Yamaguchi et al. |
| 4,371,743 A | 2/1983 | Decker |
| 4,390,225 A | 6/1983 | Coyne et al. |
| 4,432,594 A | 2/1984 | Daggett |
| 4,544,907 A | 10/1985 | Takano |
| 4,721,862 A | 1/1988 | Cooper |
| 4,722,701 A | 2/1988 | Bradt |
| 4,761,148 A | 8/1988 | Sappington |
| 4,768,968 A | 9/1988 | Daggett et al. |
| 4,810,991 A | 3/1989 | Olesak et al. |
| 4,830,631 A | 5/1989 | Hsueh |
| 4,837,546 A | 6/1989 | Bernstein |
| 4,845,708 A | 7/1989 | Herrmann, Jr. et al. |
| 4,846,733 A | 7/1989 | Baisz et al. |
| 4,880,398 A | 11/1989 | Hsueh |
| 4,921,450 A | 5/1990 | Herbert |
| 4,941,851 A | 7/1990 | Hsueh |
| D321,683 S | 11/1991 | Marach |
| RE33,877 E | 4/1992 | Sappington |
| 5,116,246 A | 5/1992 | Perry et al. |
| 5,125,855 A | 6/1992 | Brooks |
| 5,150,094 A | 9/1992 | Babini |
| 5,277,626 A | 1/1994 | Oikawa et al. |
| 5,324,214 A | 6/1994 | De Castro |
| 5,365,395 A | 11/1994 | Callaway |
| 5,476,396 A | 12/1995 | De Castro |
| 5,488,345 A | 1/1996 | Seki et al. |
| 5,515,023 A | 5/1996 | Marach et al. |
| 5,629,663 A | 5/1997 | Seki et al. |
| 5,632,654 A | 5/1997 | Sugiura |
| D381,010 S | 7/1997 | Ansley |
| 5,643,693 A | 7/1997 | Hill et al. |
| 5,659,283 A | 8/1997 | Arratia |
| 5,680,088 A | 10/1997 | Seki et al. |
| D406,111 S | 2/1999 | Awbrey |
| D408,368 S | 4/1999 | Awbrey et al. |
| 5,906,514 A | 5/1999 | Nelson, Jr. |
| RE36,317 E | 9/1999 | Arratia |
| 5,949,148 A | 9/1999 | Wagner |
| 5,995,380 A * | 11/1999 | Maue et al. .................. 361/826 |
| 6,186,633 B1 | 2/2001 | Zen et al. |
| 6,215,173 B1 | 4/2001 | Echigoya |
| 6,350,949 B1 * | 2/2002 | Boyd .......................... 174/50.5 |
| 6,431,880 B1 | 8/2002 | Davis et al. |
| 6,437,986 B1 | 8/2002 | Koshiba |
| 6,443,771 B2 | 9/2002 | Kondo et al. |
| 6,457,995 B1 | 10/2002 | Brooks |
| 6,504,468 B2 | 1/2003 | Lee et al. |
| 6,560,123 B1 | 5/2003 | de Varennes et al. |
| 6,700,081 B1 | 3/2004 | Houck, III |
| 6,724,291 B1 | 4/2004 | Byaliy et al. |
| D490,381 S | 5/2004 | Dejan |
| 6,753,718 B2 | 6/2004 | Keum |
| 6,878,004 B2 | 4/2005 | Oh |
| 6,881,909 B2 | 4/2005 | Houck, III |
| 6,992,945 B2 | 1/2006 | Otsuka |
| D517,996 S | 3/2006 | Lacy et al. |
| 7,071,427 B2 | 7/2006 | Houck, III et al. |
| D528,998 S | 9/2006 | Song et al. |
| 7,315,006 B2 | 1/2008 | Houck, III et al. |
| 7,344,415 B2 | 3/2008 | Inaba et al. |
| 2004/0074556 A1* | 4/2004 | O'Connell ........................ 141/1 |
| 2007/0034589 A1* | 2/2007 | Zeide ........................... 215/222 |

\* cited by examiner

FLEXIBLE POWER DISTRIBUTION MODULE

BACKGROUND

The present disclosure relates to the field of electrical protection. More particularly, the present disclosure relates to fuses and junction boxes for fuses, relays, and the like.

Known fuse blocks and junction boxes for automobiles are complicated. FIG. 1 illustrates a known junction box A. Junction box A includes a number of primary components, such as a fuse block B, a cover C and a lower housing D. Fuse block B includes an upper press-fit layer E that mates with a lower press-fit layer F. Upper and lower press-fit layers E and F mate with an upper housing G, which collectively mate with the lower housing D. The cover C mates with the upper housing G.

Known fuse block B holds a number of electrical devices H. For example, the electrical devices H can include JCASE® fuses and MINI® fuses provided by the assignee of this invention, mini and micro relays, and solid state relays.

The fuses I are individually inserted frictionally into a pair of projections M and N, which are provided by a terminal J (FIG. 2). Terminal J is held fixed by upper and lower press-fit layers E and F. The upper housing G defines apertures. Projections M and N of terminal J extend into the apertures, so that an operator may place a fuse I into the pair of projections M and N.

Referring to FIG. 2, a known "tuning fork" type terminal J is illustrated. Terminal J includes downwardly extending projections K and L, which extend through layer E, and through lower housing D for electrical connection to distribution wires within an automobile. Tuning fork terminal J also includes upwardly extending projections M and N, which resemble a turning fork, and which extend through apertures in upper housing G. Projections M and N engage one of the blades of a male blade fuse I as described above.

It should be appreciated that known fuse block B of known junction box A includes a multitude of components that must assemble together. The multiple press-fitting components force the fuse block manufacturers to standardize on a single design for a particular type(s) of fuses, e.g., the JCASE® fuses and MINI® fuses. The standard design has to fit into each different automobile regardless of available space and need of the automobile. Some automobile manufacturers have accordingly tended to provide only one junction box A per vehicle, which creates a condition in which the load wires that run from the various electrical devices have to run all the way to the single junction box A regardless of the position of the load device in the vehicle. Extended lengths of load wires create weight, cost and increase the potential for short-circuiting.

A need therefore exists to provide a simplified and more flexible automobile fuse block and junction box employing same.

SUMMARY

The present disclosure provides a flexible electrical center ("FLEC") or power distribution module (e.g., for vehicles such as automobiles, trucks, motorcycles, boats, wave-runners, heavy-duty transportation vehicles, all-terrain vehicles and other types of sports, recreational and specialty vehicles). The power distribution module houses replaceable fuses and other types of circuit protection devices as discussed herein. The power distribution module in one embodiment includes several main components, namely: a main housing including a component grid; a printed circuit board ("PCB") having component terminals, connector terminals and a buss bar; a base plate having a base seal; and a cover plate having a cover seal. The PCB-based system uses thin traces to connect the fuses, etc., to the terminals, which allows for a relatively high component and circuit density. To this end, the PCB can have multiple layers as described herein.

The housing is made of an insulating material, such as plastic. The housing is molded to form a desired shape and component grid. The component grid includes apertures forming footprints for the various fuses that plug into the housing (and into aligned fuse mounting terminals connected to the PCB). The footprints can be for male type components (e.g., MINI®, MAXI® and ATO® type fuses and relays) or female type fuses (e.g., JCASE® fuses provided by the assignee of the present disclosure). The component grids can be customized for different customers and different vehicle types for different vehicles of a particular customer. The housing and resulting power distribution module of the present disclosure is accordingly flexible and tailorable to a customer's specific needs.

The housing is also molded to provide connector mounts in any desired amount and type. Mating harness connectors or ring terminals are plugged into the connector mounts from the top of the housing, which allows for readily accessible connections for service and cab reduce overall dimensions of the power distribution module once installed in the vehicle. Besides keyed plug connectors, the housing also holds or supports stud connectors for single or multiple built-in, bolt-in fuse holders (e.g., for MEGA® and MIDI® fuses provided by the assignee of the present disclosure). The stud connectors can also connect input/output power cables to the power distribution module of the present disclosure. The housing can have as many rows of connector mounts or studs as desired by the customer.

The connector mounts in the embodiments illustrated below are located about the component grid for ready electrical connection between the fuse mounting terminals operating with the grid and connector mounting terminals operating with the connector mounts of the housing. The connector mounting terminals, like the fuse mounting terminals, are fixed to the PCB. The terminals can be tuning fork or other female or male type terminals that attach mechanically to the PCB. The terminals can be through-hole mounted or surface mounted to the PCB.

The PCB provides the circuit routing between the fuses and terminal connections. The PCB includes traces that run from the fuse mounting terminals to the connector terminals, stud connectors, etc. The PCB is made of FR-4 material but can alternatively be ceramic if a more rigid material is needed. The PCB can be single or multilayered and is customized as desired by the customer. The PCB can provide a wider trace that serves as a buss bar or common connection for the fuse mounting terminals and connector terminals. The buss bar can alternatively or additionally include a connected metal bar, which also acts as a heat sink for the power distribution module.

The PCB can also hold other types of circuit protection, such as overvoltage protection in the form of medal oxide varistors ("MOV's"), diodes, and thyristors. The overvoltage protection devices can be used for example to protect low operating voltage or signal level devices placed in the automobile. The overvoltage protection devices can be mounted on a same side of the PCB as the fuses or be located on the opposite or bottom side of the PCB.

The PCB in one embodiment also mounts lights, e.g., light-emitting diodes ("LED's"), which are used for any desired purpose. One use for the LED's is to provide open fuse indication. Here, the LED is placed in parallel with a trace powering one of the fuse mounting terminals. A resistor is placed in series with the LED. The resistor normally prevents current from flowing through the LED. When the fuse element of a fuse inserted into the fuse mounting terminal opens, however, all current is shunted through the resistor and the LED, illuminating the LED. The LED is placed proximate to the fuse to indicate which fuse has opened. The housing can have an opening directly above the LED so that it can be viewed readily.

A cover (e.g., plastic) connects removably to the housing and covers the circuit protection components. The cover can be removed to replace an opened fuse or to inspect the power distribution grid for whatever reason. The cover includes a seal that prevents dust, moisture and other contaminants from reaching the circuit protection devices. The cover can snap-fit to the housing and/or include one or more latching mechanism to secure the cover to the housing releasably. In an alternative embodiment, the cover is threaded onto the housing and can include a spring seal that provides a tensile force against the cover, which tends to hold the cover in a tight, threaded relationship with the housing even when the vehicle is moving and creating vibrations that could otherwise tend to loosen the screw cover. The spring mechanism can also provide a seal between the cover and the housing.

In one embodiment, a base (e.g., plastic) connects sealingly to the bottom side of the housing, beneath the PCB. The base can be a substantially flat piece that bolts or snap-fits for example to the housing. There can be a separate o-ring type seal that seals the base to the housing the seal can alternatively be molded with and carried by the base. The base alternatively includes venting holes, in which case the base may or may not connect sealingly to the housing. Further alternatively, the base includes a plug, such as a Gortex™ plug that allows venting, but which maintains a seal.

The power distribution module also includes a fuse puller stored in the housing or cover. The housing also provides spare fuse holding positions. The cover provides desired marking and logo information either on the outside of the cover, inside of the cover or both, as is needed. The cover can be clear so that the LED's if provided can be seen without having to remove the cover, while still providing fuse rating and logo information.

In one primary embodiment, the power distribution module is provided in a non-feed-through arrangement with the base plate being at least substantially flat as described. Here, the fuses are inserted from the top of the housing and PCB when the cover has been removed as has been described. The fuse mounting and connector mounting terminals are therefore located on only one side of the PCB, although portions of the terminals may protrude through the PCB when thoughhole mounted to the PCB. Even so, the PCB may have overvoltage protection components mounted to the bottom side of the PCB and the PCB may be multilayered.

In another primary embodiment, the power distribution module is provided in a feed-through arrangement. Here, the base plate is replaced with in essence the mirror imager of the top of the housing and an additional removable cover for the replacement of opened fuses, which are now inserted from both the top and bottom (or left side and right side depending on the mounting arrangement of the module). Both housing portions accordingly have component grids and fuse footprints. Both housings can also provide connector mounts. The fuse mounting and connector mounting terminals are now located on both sides of the PCB. Such terminals can be though-hole mounted to the PCB (upper terminals located in different positions on the PCB than the lower terminals), surface mounted to the PCB (so that two terminals can be located at the same position but on opposite sides of the PCB) or some combination thereof. Here, the PCB may have overvoltage protection components and/or LED's mounted to either or both sides of the PCB and the PCB may be multilayered. The feed-through module increases component capacity of the module for at least approximately the same mounting dimensions as the non-feed-through module. The feed-through module can also be structured to have components one side of the module and wires or connectors on the other or backside of the module. No cover is needed on the backside in such case.

In either the non-feed-through or feed-through embodiments, the fuse cover can be threaded onto the housing or snap-fitted to it (and be round or polygonal). When threaded to the housing, the cover and housing include mating locking mechanisms that allow the cover to lock releasably to the housing.

In the feed-through embodiments, the connector mounts can be provided on leaves of the housing that extend out from the component grid and fuse holding portion of the housing. Here, a base or bottom cover can also either connect threadingly or snap-fit to the housing. In one alternative embodiment, the housing does not provide connector mount leaves, and the connector mounts are provided instead on the base or bottom cover. Here, the base or bottom cover translates onto the housing, so that it can slide over the connector terminals for assembly and repair. In another alternative embodiment, the housing provides neither connector mount leaves nor connector mounts. Instead, wires are fed through the base or bottom cover and connected directly to the fuse mounting terminals, such that separate connector mounting terminals and associated PCB traces are not needed. Indeed, the PCB can be replaced with a plastic substrate that holds the fuse mounting terminals. Here too, the base or bottom cover translates onto the housing, so that it can slide over the wires for assembly and repair.

Further described herein is a sealing mechanism for the stud connectors. Again, the stud connectors mount higher rated fuses or hold cables, such as a battery or power cables. The sealing mechanism includes a conductive, e.g., copper, block that connects to the PCB and electrically to at least one trace on the PCB. The block is sealed to an associated housing leaf via an o-ring seal for example. The block is sealed to the stud via an epoxy, such as Loctite® epoxy, or via a plastic or rubber sleeve. Accordingly, the mechanism seals any possible entry of contaminants into the housing around the stud connector.

Another aspect of the present disclosure is the modularity of the various power distribution modules. Whether non-feed-through, feed-through, screw cover, snap-on cover, bolt-on cover, screw base, snap-on base, bolt-on base, single leafed, two-leafed, three-leafed, four-leafed, having single stack connector mounting leaves or multiple stack connector mounting leaves, the modules in one embodiment have the same mounting footprint so that the customer can switch out modules without changing the customer's mounting configuration. Also discussed herein is a method of making modules having different numbers of connector mounting leaves using a same mold by blocking unwanted leaves during the filling of the mold.

It is accordingly one advantage of the present disclosure to provide an improved power distribution module, for example, for vehicles.

It is another advantage of the present disclosure to provide a more flexible power distribution module for vehicles.

It is a further advantage of the present disclosure to provide a power distribution module for vehicles, which is relatively easy to manufacture and install.

It is still another advantage of the present disclosure to provide a power distribution module for vehicles, which provides relatively high component and circuit density.

It is yet another advantage of the present disclosure to provide a power distribution module for vehicles, which has a feed-through configuration that further increases the amount of components and/or circuitry allowable in a same footprint capacity.

It is still a further advantage of the present disclosure to provide a ready way to manufacture different module housings via a same mold.

Further still, it is an advantage of the present disclosure to provide a power distribution module having standardized mounting hole pattern so that the customer can swap out different modules without reconfiguring the customer's mounting apparatus.

Moreover, it is an advantage of the present disclosure to provide power distribution modules that are sealed well from the outside world and that are opened easily for repair or component replacement.

Additional features and advantages are described herein, and will be apparent from the following Detailed Description and the figures.

DETAILED DESCRIPTION

Figure 1:
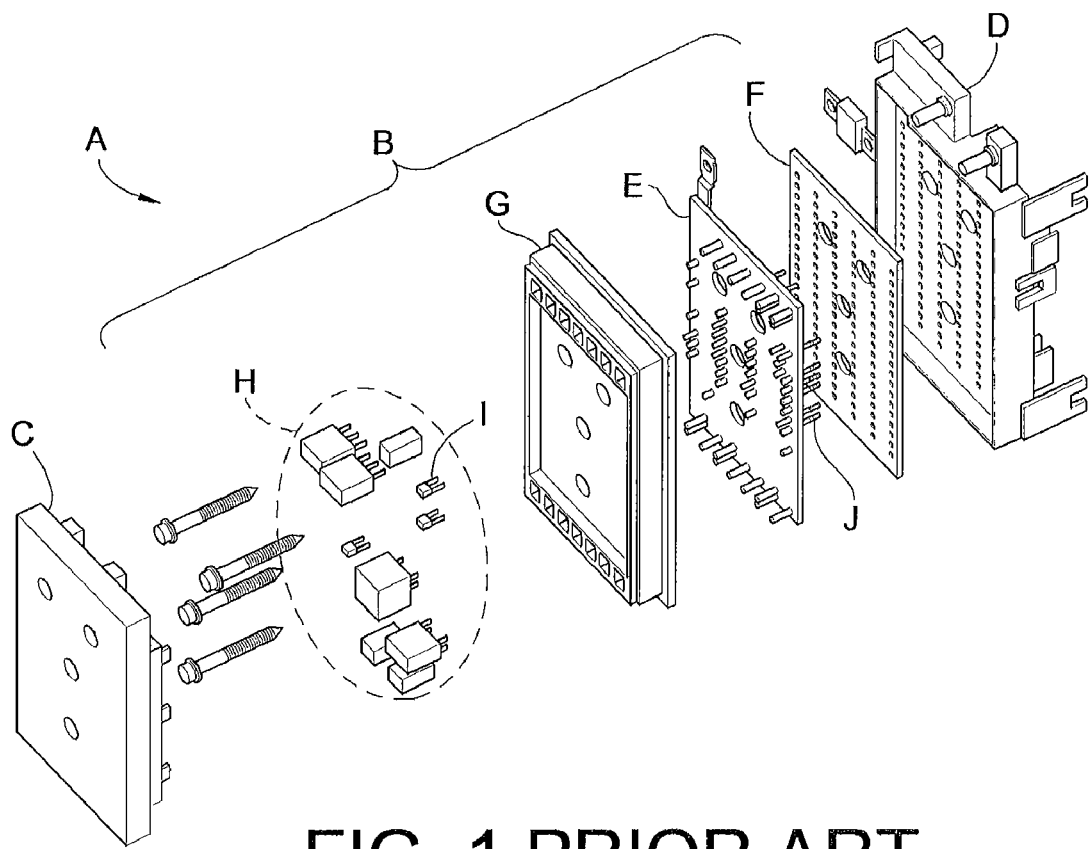
FIG. 1 is a perspective view of a prior art junction box and fuse block.
Figure 2:
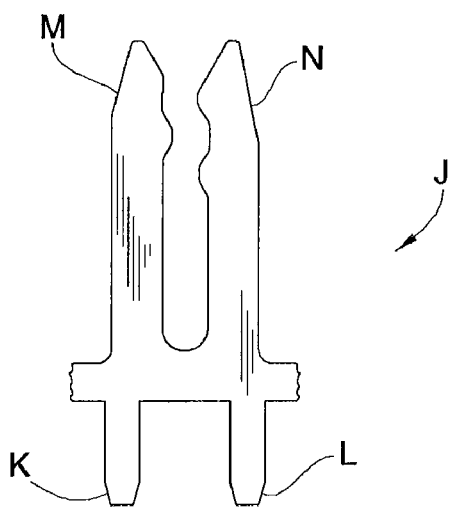
FIG. 2 is an elevation view of a prior art fuse holding terminal.

Referring now to the drawings in the particular new FIGS. 3 to 9, power distribution module 10 illustrates one non-feed-through embodiment of the present disclosure. As seen in the exploded views of FIGS. 3 and 6, power distribution module 10 includes a housing 12, a cover 50 connected removeably to housing 12, a printed circuit board ("PCB") 70 having components and connector terminals (the PCB inserted into housing 12) and a base 60 connected removeably to a bottom portion of housing 12 and sealing the PCB from the outside environment. Housing 12 cover 50 and base 60 can be made of the same or different materials, such as an insulating plastic, e.g., nylon, glass-filled nylon, polyester and polycarbonate. Printed circuit board 70 in one embodiment is made of an FR-4 material. The PCB is alternatively made of ceramic if additional rigidity is needed.

Figure 3:
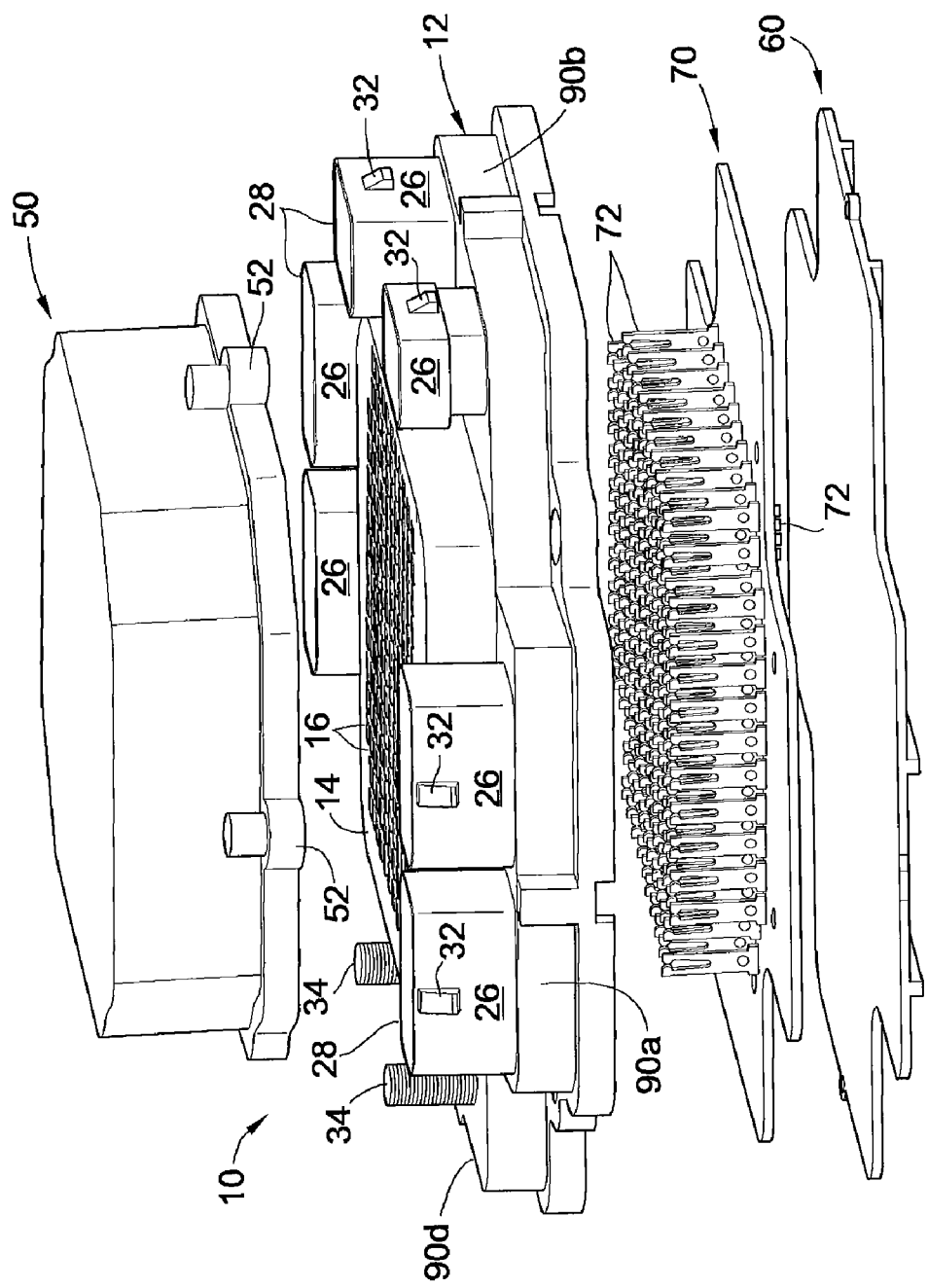
FIG. 3 is a an exploded perspective view of one non-feed through embodiment of a power distribution module of the present disclosure.
Figure 7:
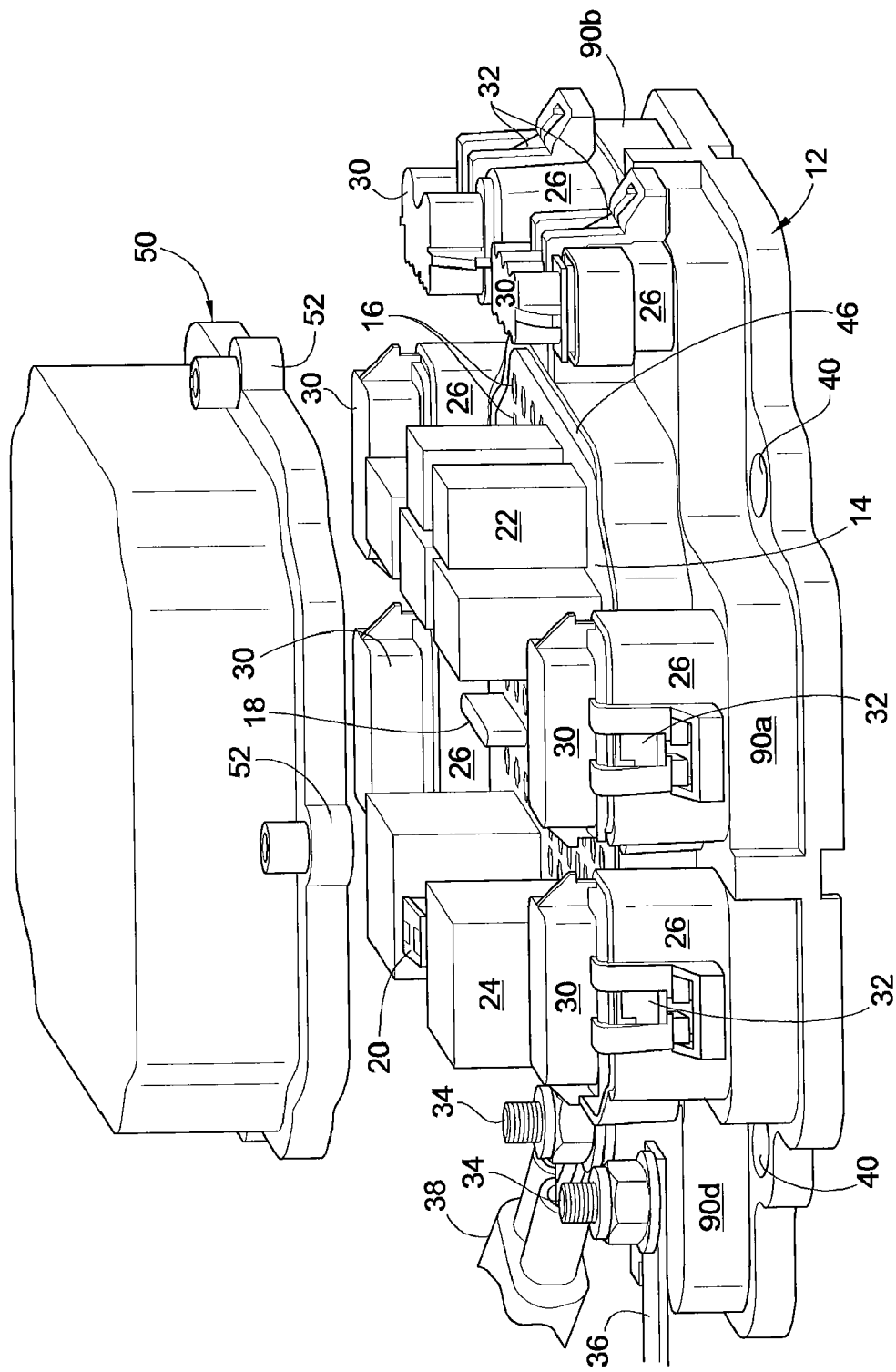
FIG. 7 is a perspective view of an exploded cover and housing of the power distribution module according to the embodiment of FIG. 3.

Housing 12 in the illustrated embodiment is a molded plastic piece having a centrally located component grid 14. Component grid 14 is shown best in FIGS. 3, 7, 8 and 9 from two different sides as having a plurality of footprint apertures 16, forming a plurality of footprints for a plurality of fuses or circuit protection devices (overcurrent or overvoltage) that are plugged into component grid 14 of housing 12 of power distribution module 10. Apertures 16 can form a plurality of the same types of fuses, as seen for example in FIG. 3. Alternatively, apertures 16 form different footprints for different types of component footprints, as shown for example in FIG. 7. In the example of FIG. 3, apertures 16 form footprints for a plurality of male blade type fuses, such as MINIS fuses provided by the assignee of the present disclosure. FIG. 7 on the other hand illustrates that apertures 16 can form footprints for the male type (e.g., MINI®) blade fuses 18, female cartridge fuses 20 (e.g., J-CASE® fuses provided by the assignee of the present disclosure) or larger type fuses, such as ATO® fuses provided by the assignee of the present disclosure or MAXI® fuses also provided by the assignee of the present disclosure. Components 22 are micro-relays, while components 24 are ISO/power relays. Module 10 is accordingly not limited to fuse operation.

The fuses and other components are illustrated for automotive uses, such as for cars, trucks, motorcycles, boats, wave-runners, all-terrain vehicles and other types of sports vehicles or others listed above. The teachings of the present disclosure and the benefits and advantages of power distribution module 10 are however not limited to vehicle type applications.

Housing 12 also includes or defines a plurality of connector mounts or holders 26 that are located about component grid 14 in the illustrated embodiment. Locating connector mounts 26 around central grid 14 is an efficient way to space the connectors from the fuses for electrically connecting connectors 30 (e.g., FIGS. 6 and 7) and the fuses 18, 20, and relays 22, 24 via traces 80 (FIG. 10) on PCB 70. Connector mounts 26 include walls 28 that guide connectors 30 to the correct location and in the correct orientation.

Connector mounts 26, like the component footprints via apertures 16, can also be sized as illustrated to fit different sizes and types of connectors 30, and in any desired quantity of each connector 30. While power distribution module 10 in FIGS. 2 to 9 shows two connector mounts 26 on three sides of component grid 14, connector mounts 26 are alternatively not provided on one or more sides of grid 14 if not needed or are stacked in two or more rows away from grid 14 if additional connectors are needed. Further alternatively, grid 14 can be split into two or more grids with one or more connector mount 30 placed between at least two of the split apart grids. As seen in FIGS. 2 to 9, connector mounts 26 in one embodiment include or provide one or more locking mechanism 32 that locks a mating connector 30 in place, as seen for example in FIGS. 6 to 8.

Figure 5:
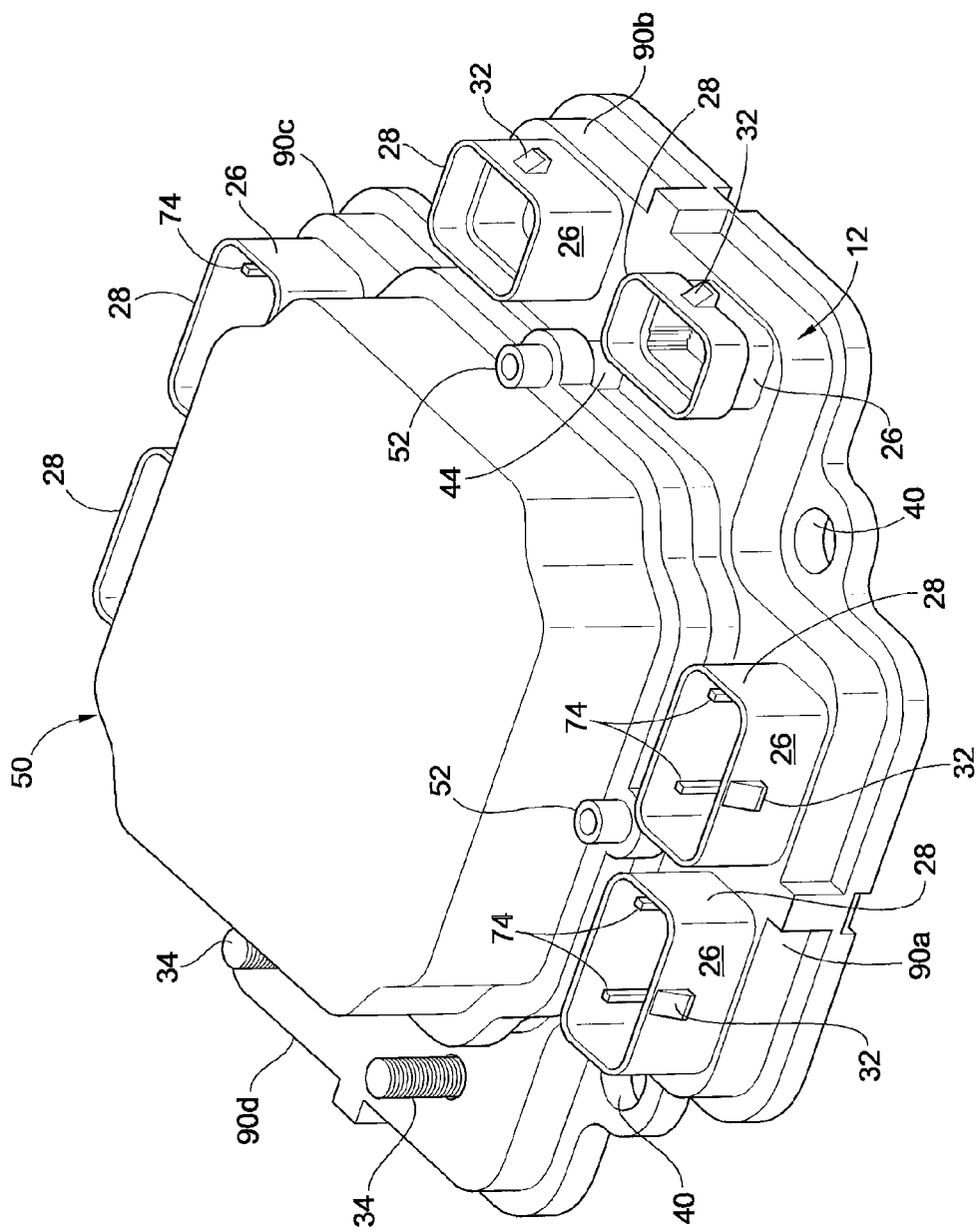
FIG. 5 is a perspective view of an assembled cover and housing of the power distribution module according to the embodiment of FIG. 3.

FIGS. 3, 5 and 7 also illustrate that housing 12 secures and provides stud connectors 34. Stud connectors 34 mount one or more built-in, bolt-in type fuse, such as a MEGA® or MIDI® fuse provided by the assignee of the present disclosure. FIG. 7 also illustrates a bus bar 36 and a battery cable or power cable 38 connected to one of the stud connectors 34. Thus it should be appreciated that housing 12 allows for many different types of fuses and connectors as desired by the customer for a particular application.

Housing 12 further provides mounting holes 40 for the mounting of power distribution module 10 within a vehicle or other application. Although not illustrated, housing 12 in one embodiment further provides an onboard fuse puller and positions for storing spare fuses. The fuse puller/fuse holder is provided alternatively with cover 50.

Figure 9:
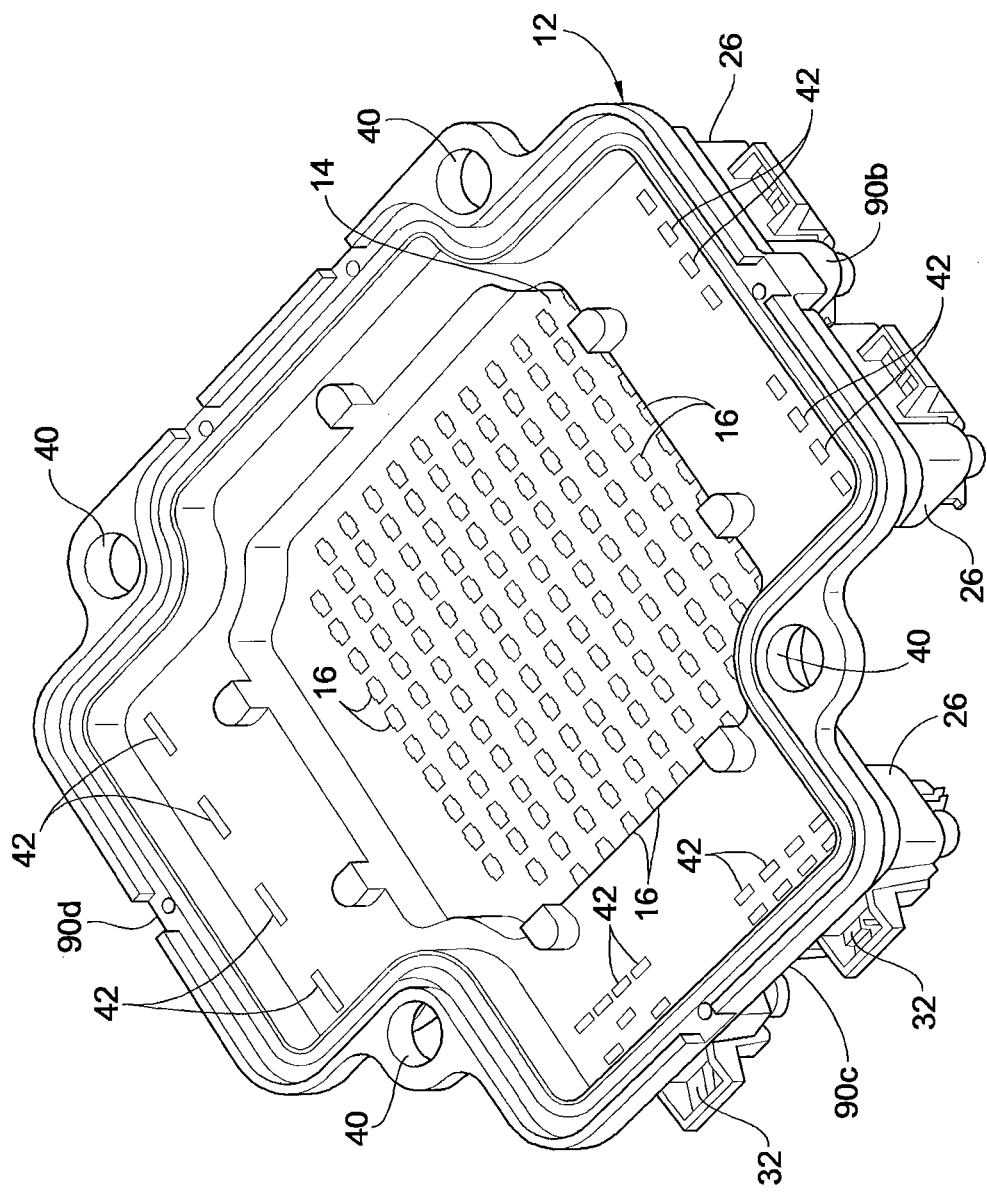
FIG. 9 is a perspective view of the underside of a housing including a component grid of the power distribution module according to the embodiment of FIG. 3.

FIG. 9 shows that housing 12 forms a hollow shell that allows PCB 70 to be inserted up into housing 12 and for the fuse mounting terminals connected to the PCB to come into alignment with fuse footprints defined by apertures 16 of grid 14. Likewise, connector mounting terminals affixed to PCB 70 come into alignment with and extend through connector terminal apertures 42 provided in housing 12, which provide footprints for the connectors to mate with connector mounting terminals attached to the PCB. The component mounting terminals and connector mounting terminals are spaced apart from each other on PCB 70, so as to align with insertion apertures 16 and connector terminal apertures 42 formed in housing 12.

Figure 8:
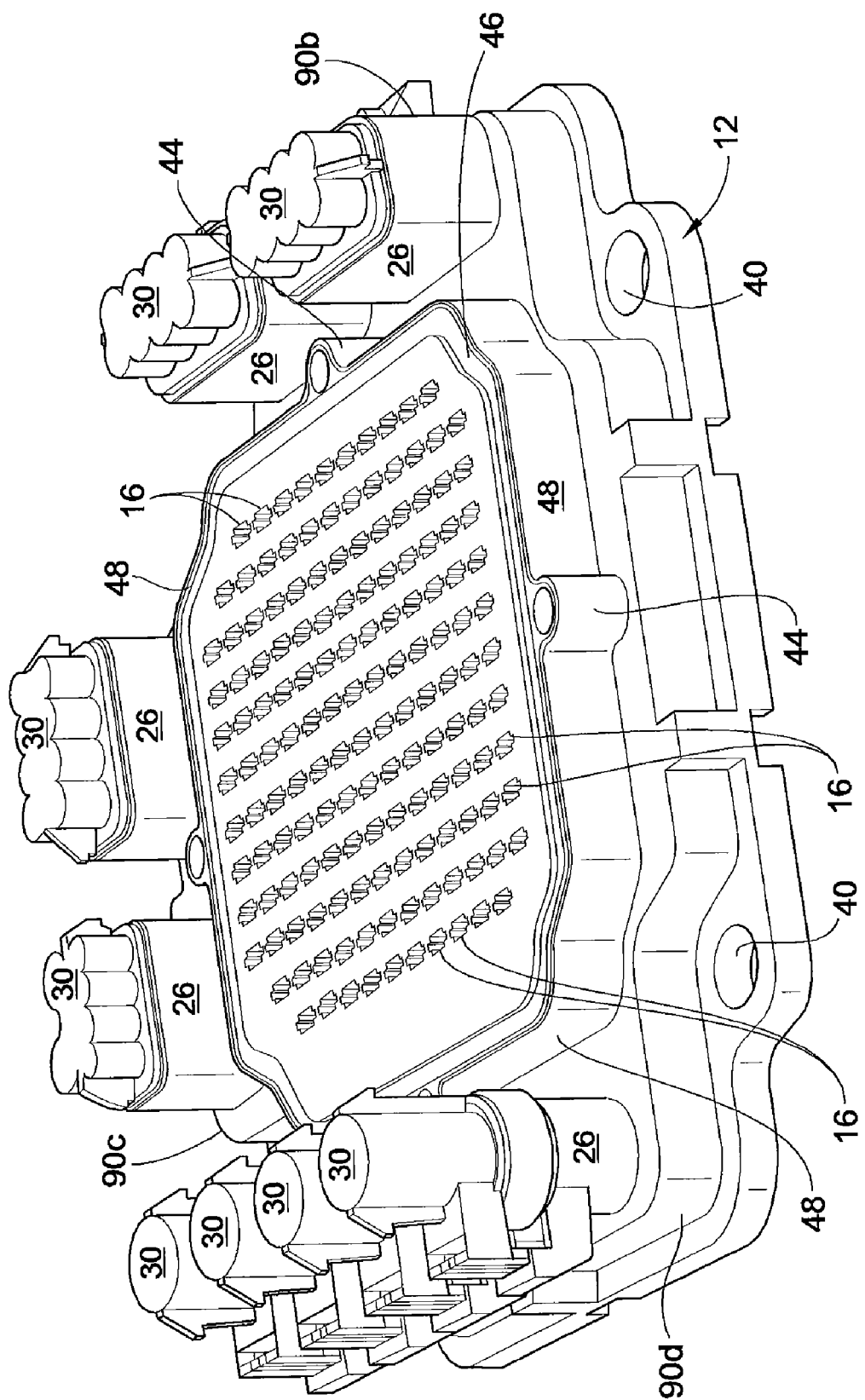
FIG. 8 is a perspective view of a housing including a component grid of the power distribution module according to the embodiment of FIG. 3.

FIG. 5 illustrates that housing 12 in one embodiment provides mounting holes 44 that accept screws or bolt to removeably mount a cover 50 to housing 12. FIGS. 7 and 8 illustrate that housing 12 further includes or defines a sealing ring 46 that accepts an o-ring type seal, such that cover 50 is sealed to housing 12 when bolted, snap-fitted or threaded onto housing 12 (see FIGS. 12 to 19 for threaded). Cover 50 also forms a hollow shell shape to allow room for components 18, 20, 22 and 24 to reside above component grid 14 as seen in FIG. 7. Cover 50 in FIGS. 3, 5 and 7 includes or defines mounting holes 52 that mate with threaded holes 44 of housing 12 to allow cover 50 to be bolted to housing 12 in one embodiment. FIG. 8 illustrates an alternative embodiment in which cover 50 snap-fits or press-fits about an outer edge 48 forming a sealing ring 46 with component grid 14.

Cover 50 is opaque as shown or clear as desired. As described below, the PCB provides light-emitting diodes ("LED's") in one embodiment. Cover 50 can be clear, such that an operator can view the LED's for whatever information they provide. Whether clear or opaque, cover 50 in one embodiment provides one or more of fuse rating, type and logo information either on the outside of the cover, inside of the cover or both. Although not illustrated, a strap can be provided that loosely holds cover 50 to housing 12, such that the cover cannot fall from the housing when removed therefrom and become lost or stuck somewhere inside the vehicle's engine.

Figure 4:
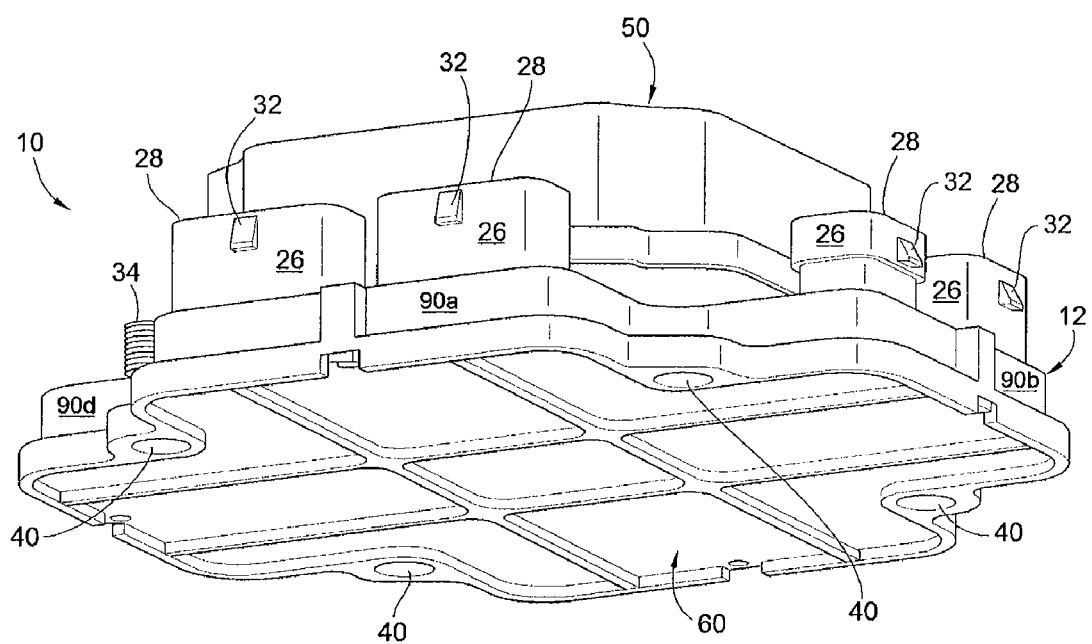
FIG. 4 is a perspective view of an assembled power distribution module according to the embodiment of FIG. 3.
Figure 6:
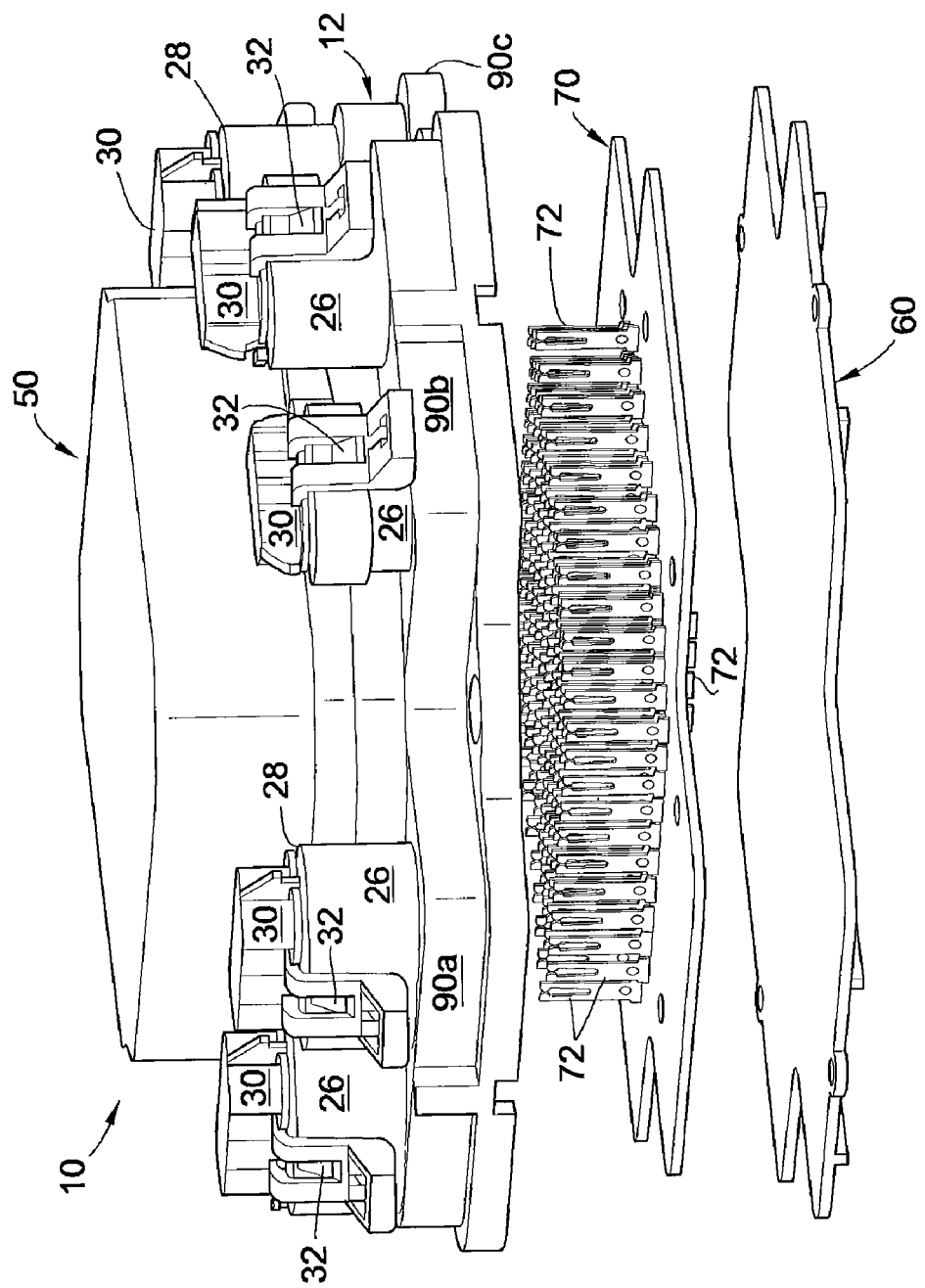
FIG. 6 is a perspective view of an assembled cover and housing and exploded printed circuit board ("PCB") and base of the power distribution module according to the embodiment of FIG. 3.

FIGS. 3, 4 and 6 illustrate that in the non-feed through embodiment, base 60 is at least substantially flat and releasably secured to the underside of housing 12. Base plate 60 is snap-fitted, press-fitted or fastened to housing 12 in various embodiments. Base plate 60 is connected sealingly to housing 12 in one embodiment by either an integral seal formed at either housing 12 or base plate 60 or via a separate o-ring type seal. In another embodiment, either one or both of cover 50 and base plate 60 provides one or more venting aperture. In such case, the cover 50 or base plate 60 may or may not be sealed to housing 12.

FIGS. 3, 5 and 6 illustrate that power distribution module 10 includes a printed circuit board 70, to which fuse mounting terminals 72 (FIGS. 3 and 6) and connector mounting terminals 78 (FIGS. 5 and 10) are mounted. Fuse mounting terminals 72 (e.g., having a tuning fork like configuration) and connector mounting terminals 78 in one embodiment are mechanically fixed to PCB 70 via through-holes provided in the PCB. Here, a small portion of the terminals extends below the PCB as seen in FIGS. 3 and 6. In this arrangement, terminals 72 and 78 may or may not additionally be soldered (e.g., wave soldered) to PCB 70. In an alternative embodiment, one or both of fuse mounting terminals 72 and connector mounting terminals 78 are surface-mounted to PCB 70. In such case, the terminals do not extend through the PCB. Surface mounting is especially advantageous for the feed-through embodiment, in which terminals extend from both sides of PCB 70, increasing fuse component capacity.

A male blade-type fuse (e.g., a MINI® fuse provided by the assignee of the present disclosure) includes a pair of blade terminals, each of which press fits into one of fuse mounting terminals 72 shown in FIGS. 3 and 6. For each fuse, one of terminals 72 connects to a trace 80 (FIG. 10) that extends to a load within the vehicle. The other of the terminals connects electrically to a trace 80 that extends to a common electrical connection. FIGS. 3 and 6 illustrate that a buss bar 74 is connected to PCB 70. Buss bar 74 in one embodiment is soldered to a large or widened trace provided on the surface of PCB 70. Buss bar 74 can carry higher current and/or distribute current more effectively throughout PCB 70. Buss bar 74 also provides an internal heat sink for power distribution module 10. Buss bar 74 can further provide an electrical connection for discrete components, such as overvoltage protection components 76 provided on PCB 70.

Figure 10:
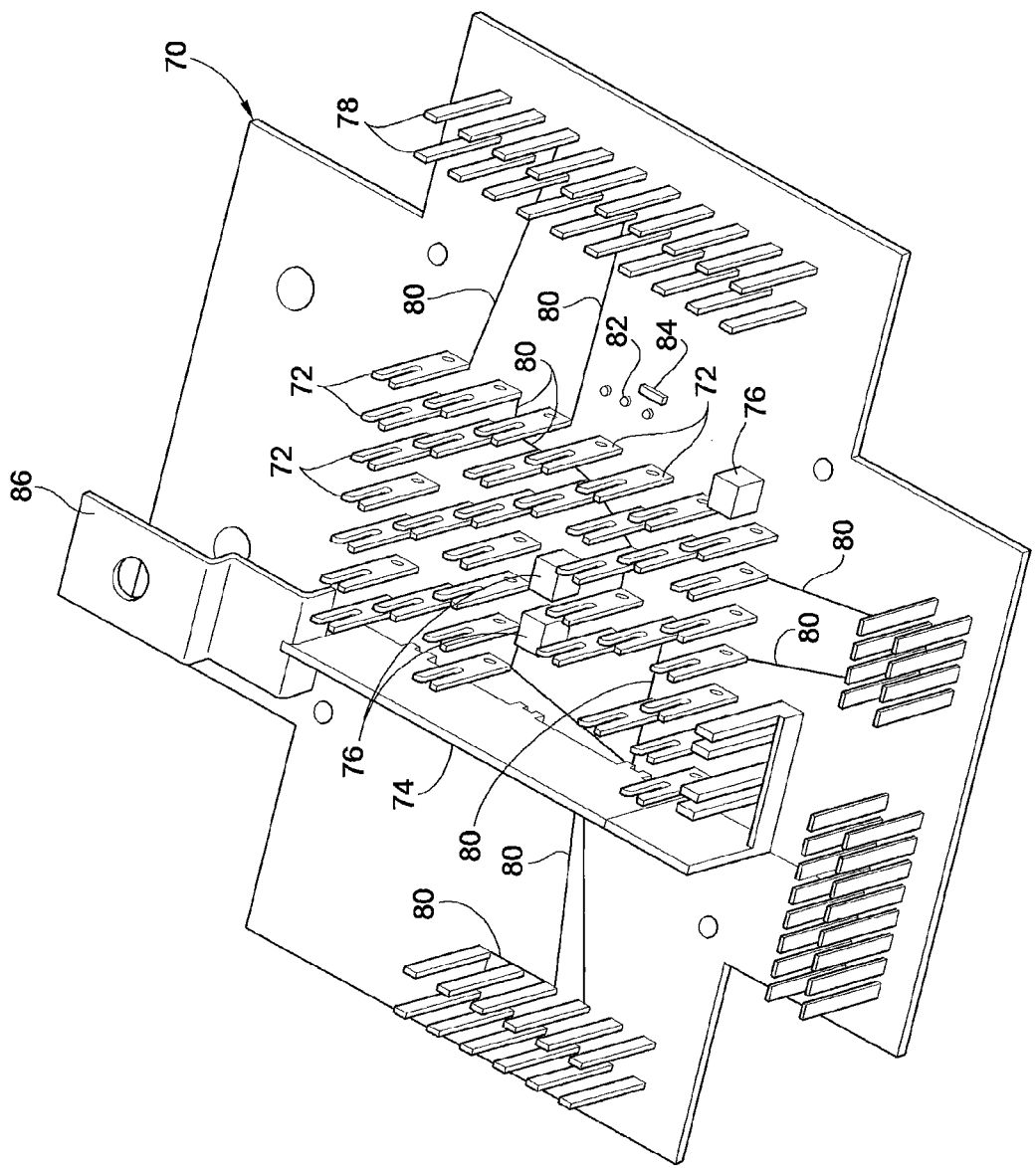
FIG. 10 is a perspective view of one embodiment of a PCB for the power distribution module of the present disclosure.

As seen in FIG. 10, buss bar 74 in one embodiment is a metal, e.g., copper, steel or stainless steel, strip that is mechanically connected and/or soldered to PCB 70. Common traces 80 for fuse terminals 72 and 78 and components 76 run to buss bar 74. Buss bar 74 also includes a bolt on terminal 86, so that the common lines and buss bar 74 can be connected to the vehicle's ground or power input.

In the illustrated embodiment of FIG. 10, overvoltage protection components 76 are shown surface-mounted to the top side of PCB 70. Alternatively or additionally, overvoltage protection components 76 are mounted to the bottomside of PCB 70. Overvoltage protection components 76 can include metal-oxide varistors ("MOV's"), varistors, diodes, diode arrays, resistors and transorbs. PCB 70 can be multi-layered if needed to support any bottomside components FIG. 10 illustrates that PCB 70 can support and electrically connect a plurality of light-emitting diodes ("LED's") 82. LED's 82 provide a number of diagnostic features, such as circuit on/off, resistance increase or an open circuit. In one embodiment, LED's 82 provide open circuit indication for individual fuses plugged into housing 12 of power distribution module 10. Here, an LED 82 is connected in parallel with the fuse and in series with a resistor 84. LED 82 and resistor 84 can be connected electrically to one of terminals 72 or 78 via outer traces 80 or via internal layer conductors.

Under a normal (unopened) condition, resistor 84 prevents an amount of current sufficient to light LED 80 from flowing through the LED. Upon an opening of the fuse, current is shunted through resistor 84 and LED 82, causing the LED to illuminate and providing open circuit indication to an operator. Here, the top of grid 14 as well as cover 50 can be clear such that LEDs 82 located on PCB 70 can be seen. Alternatively, apertures 16 can be made large enough such that light from the respective LED 82 can be seen. To this end, LED's 80 may be provided on stand-offs connected to PCB 70, such that the LED's are located closer to component grid 14 of housing 12. It may be that certain fuses are much more likely to open than others within power distribution module 10. Such fuses can be located at the outer edges of grid 14, where it is easier to locate adjacent LED's 82.

Alternatively or additionally, one or more LED 82 can be mounted to component grid 14, here, for the purpose of illuminating the fuse area when an operator removes cover 50, so that the operator can see which fuse(s) needs to be replaced, etc. This one or more LED 82 can be lighted continuously. Alternatively, the removal of a bolt from a mounting hole 52/threaded hole 44 allows a contact to be made that illuminates the one or more LED 82 located on component grid 14, so that the one or more LED 82 is lighted only when cover 50 is removed. In any case, the LED for lighting the fuses when cover 50 is removed can be coupled electrically to a capacitor, for example, which stores a voltage and allows the one or more LED to be lighted even when the power to the vehicle is cut.

FIGS. 3 to 7 and 10, show a four-leafed (90a to 90d) housing 12 for power distribution module 10. That is, connector mounting leafs 90a to 90d, having either stud mounts or mounts for different types of connectors, extend outwardly from grid 14 along all four sides of the square or rectangular grid. Accordingly, a mold for the housing is made in a configuration to form the four-leafed power distribution module 10. It is contemplated to make different four-leafed housing molds, each having a different combination of connector mounts 26 (e.g., sides can have round or rectangular connectors or stud mounts 34) to receive different connectors 30. As stated herein, it is also contemplated to stack rows or connectors at one or more leafs 90a to 90d extending from grid 14. The goal is to have a four-leafed mold that accommodates any connector arrangement that the customer desires.

FIGS. 8 and 9 have an alternative three-leafed housing 12, in which connector mounting leafs 90b to 90d extend around only three sides of component grid 14. Thus if a customer needs only enough connectors to fill three leafs 90b to 90d of grid 14 (or for example would rather use a two-leafed, stacked row housing than a four-leafed, single stack housing), the customer can elect to use the three-leafed housing 12 to save material, space and weight. In one embodiment, however, whether the customer uses a four-leafed, single stacked housing 12, a three-leafed, single stacked housing or a two-leafed, double stacked housing, the mounting footprint of the resulting power distribution module 10, set by the distance between mounting holes 40, remains the same. In this manner, the customer can swap out one power distribution module 10 for another without having to redesign the vehicle mounting bolt holder for the power distribution module.

Figure 11:
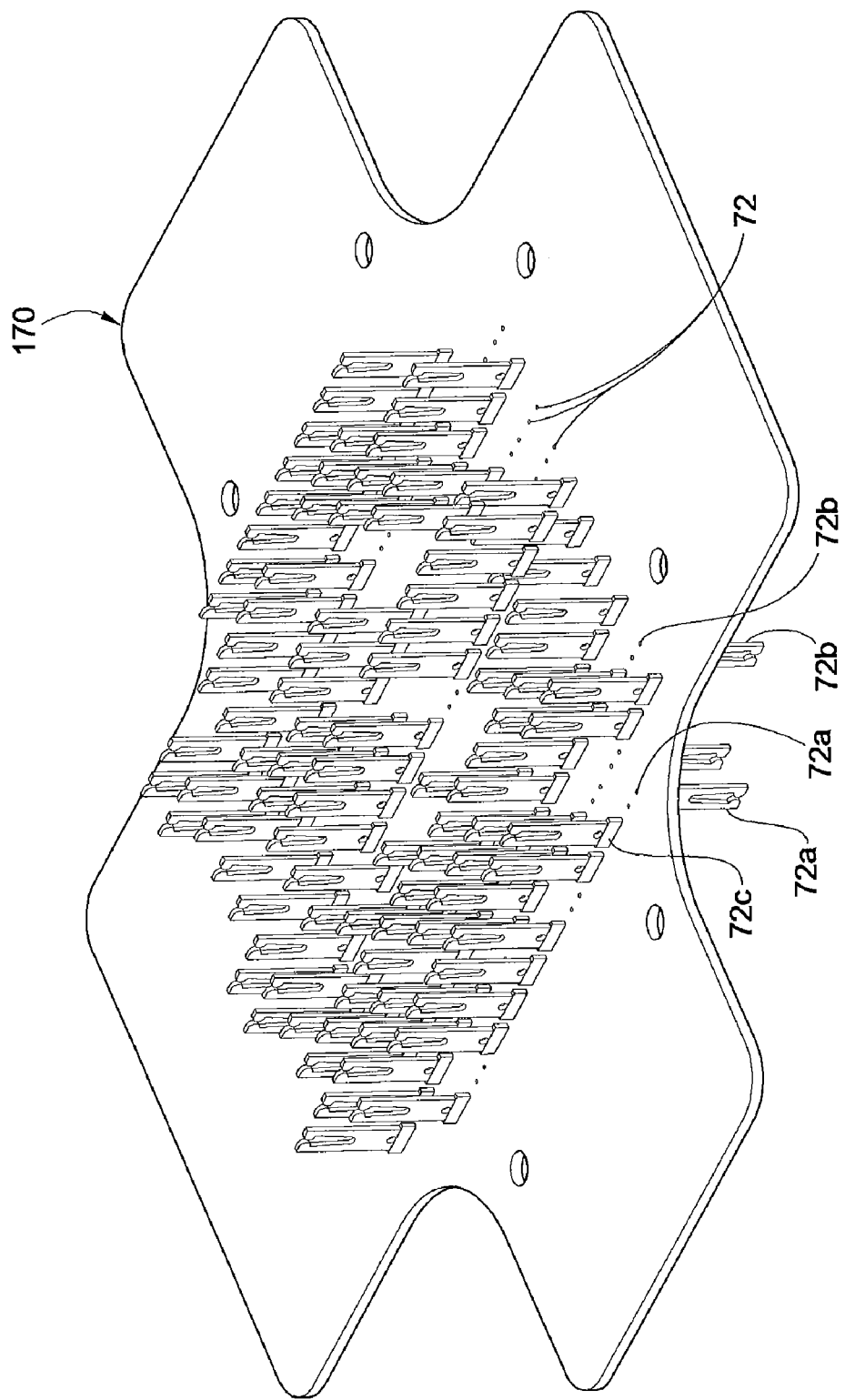
FIG. 11 is a perspective view of one embodiment of a PCB for a feed-through version of the power distribution module of the present disclosure.

FIGS. 3 to 10 show a non-feed-through embodiment of power distribution module 10. An alternative power distribution module, can have a square or rectangular grid but which has an alternative feed-through configuration. FIG. 11 shows one example of a PCB 170 for the feed-through module. In the illustrated embodiment, fuse terminals 72 are through-hole mounted, such that the real estate on PCB 170 is dedicated to a fuse terminal facing upwardly or downwardly as seen in FIG. 11. For example, fuse terminals 72a and 72b are through-hole mounted downwardly, such that the terminals peak through the top of PCB 170 as seen.

Alternatively, the terminals are surface-mounted to PCB 170 so that they can consume the same real estate of the PCB on both sides of the PCB, e.g., via wire connection of the terminals to a bus or multiple terminals bussed together. PCB 70 cal be multi-layered to support the fuse and connector terminals extending from both sides of the PCB. The feed-through housing can have a pair of component grids 14 located on both sides of PCB 70 to allow fuses to be plugged into both sides. Here, connector mounting leafs 90a to 90d can be one-sided or two-sided as needed. That is, connector mounts 26 may be provided on one side of the leafs or both sides of the leafs.

In a further alternative embodiment, the fuse terminals 72 extend in one feed-through direction, while the connector terminals 78 extend in the opposite feed-through direction. In this manner, the fuses plug into one side of the feed-through power distribution module, while the connectors plug into the opposite side of the feed-through power distribution module, providing another customization option for the systems of the present disclosure. FIGS. 17 and 18 illustrate such an arrangement for a circular component grid version of the power distribution module. The component grid is alternatively of a polygonal shape.

Figure 12A:
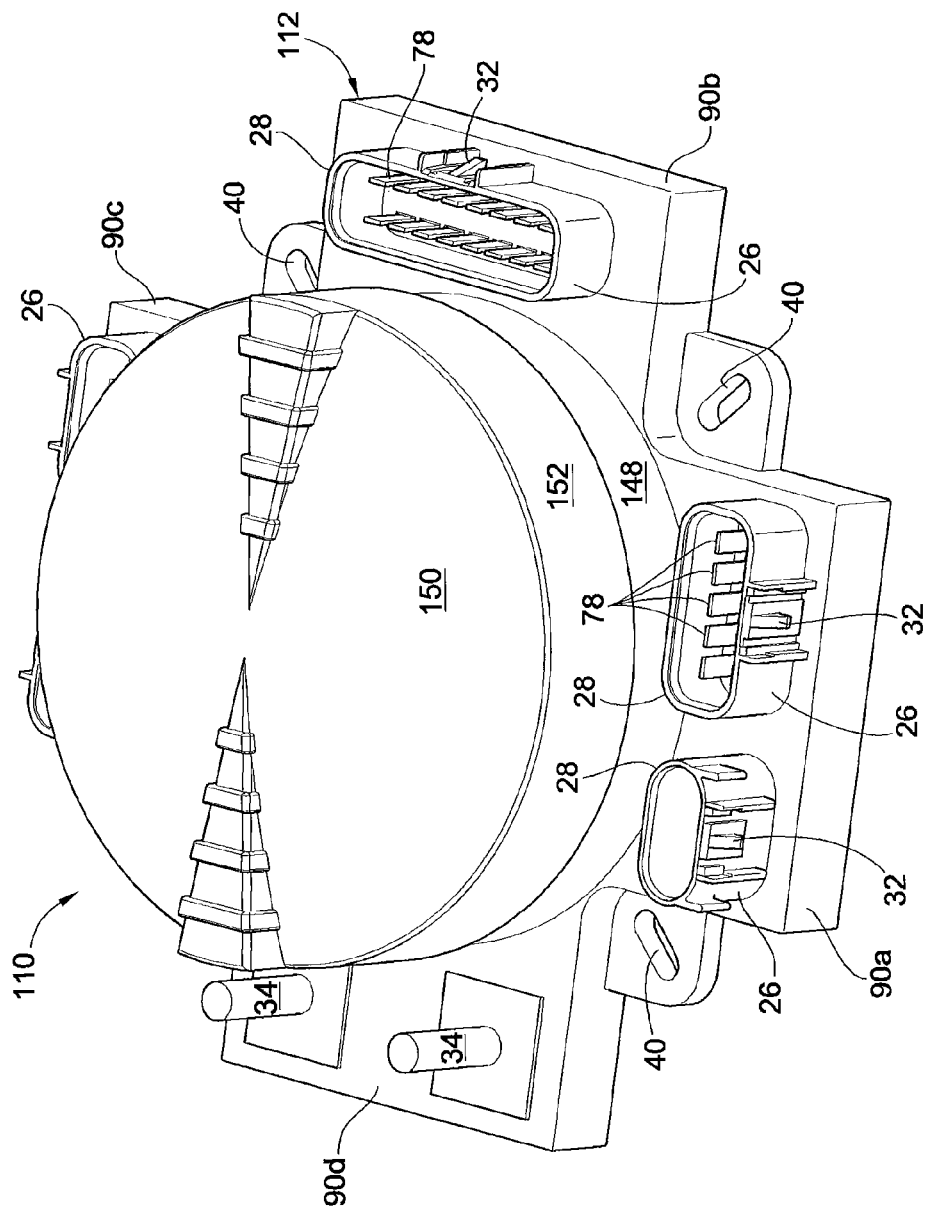
FIGS. 12A and 12B are perspective views illustrating an alternative embodiment of a power distribution module having a threaded cover and module housing.
Figure 12B:
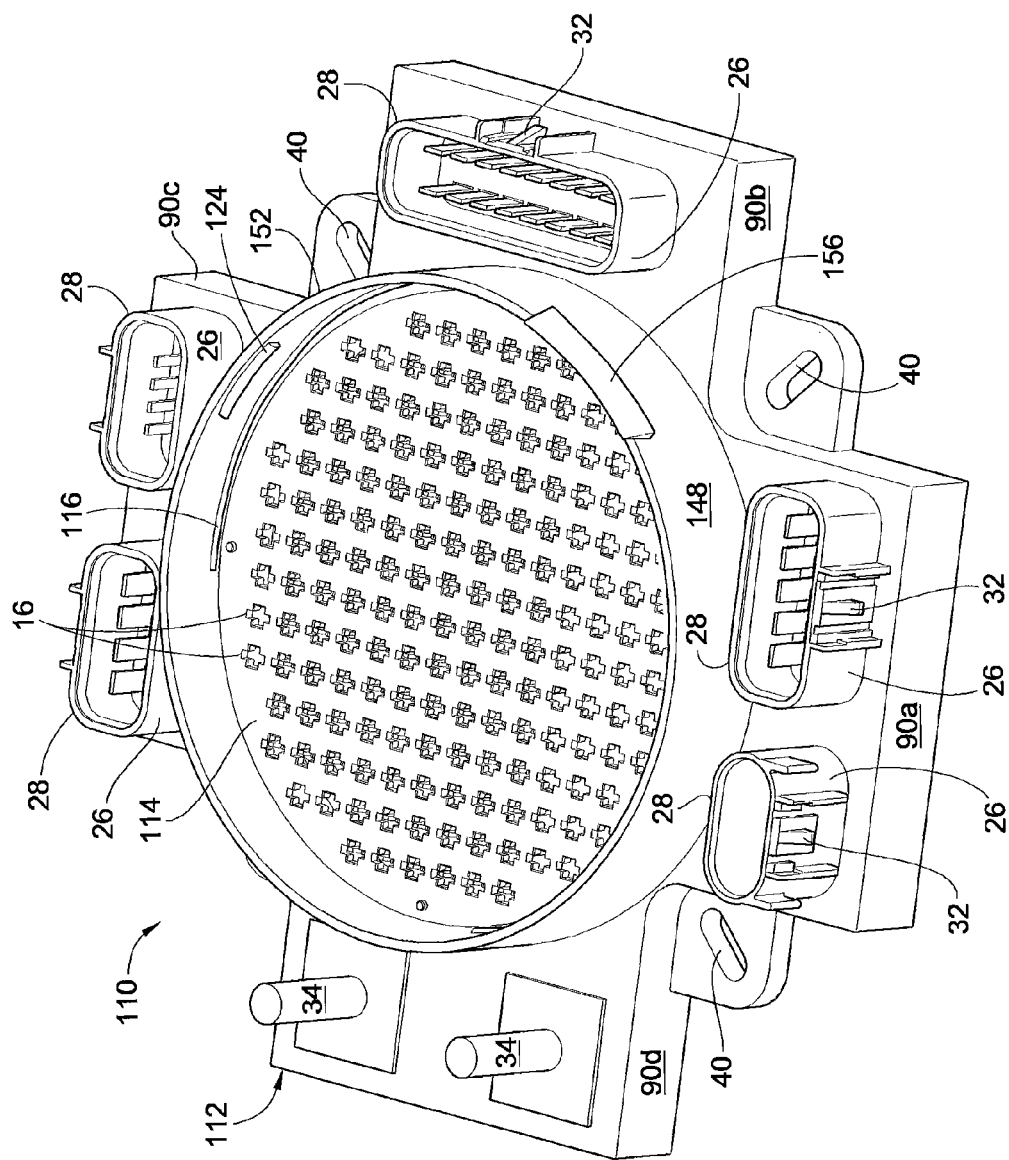

Referring now to FIGS. 12A and 12B, alternative power distribution module 110 includes a circular cover 150, which mates with an alternative circular outer edge or collar 148 extending around component grid 114. Component grid 114 itself can be also be circular as seen in FIG. 12B. The remainder of alternative housing 112 includes many of the same components discussed above for power distribution module 110, namely, four leafs 90a to 90d (or less as discussed previously), each having at least one connector mount 26 or stud connector 34. Connector mounts 26 each include a wall 28 surrounding connector terminals 78, the terminals fixed to a PCB (not seen) located beneath the component grid and connector mounts. Wall 28 is for accepting a connector 30 (e.g., at FIG. 6). The connectors lock to wall 28 of mount 26 by snap-fitting onto locking mechanisms 32. Housing 112 also includes mounting holes or slots 40, which have the same center-to-center distance as holes 40 of housing 12 in one embodiment.

FIG. 12B, shows circular cover 150 removed to expose circular component grid 114, having footprint apertures 16 that form a plurality of footprints for a plurality of fuses or overcurrent devices that are plugged into component grid 114 of housing 112 of power distribution module 110. Collar 148 includes or defines inwardly extending threads 116 that mate with outwardly extending threads 118 (not seen in FIG. 13) of cover 150. Cover 150 accordingly threads onto housing 112 for ready engagement and disengagement to view and replace fuses plugged into power distribution module 110.

Figure 13:
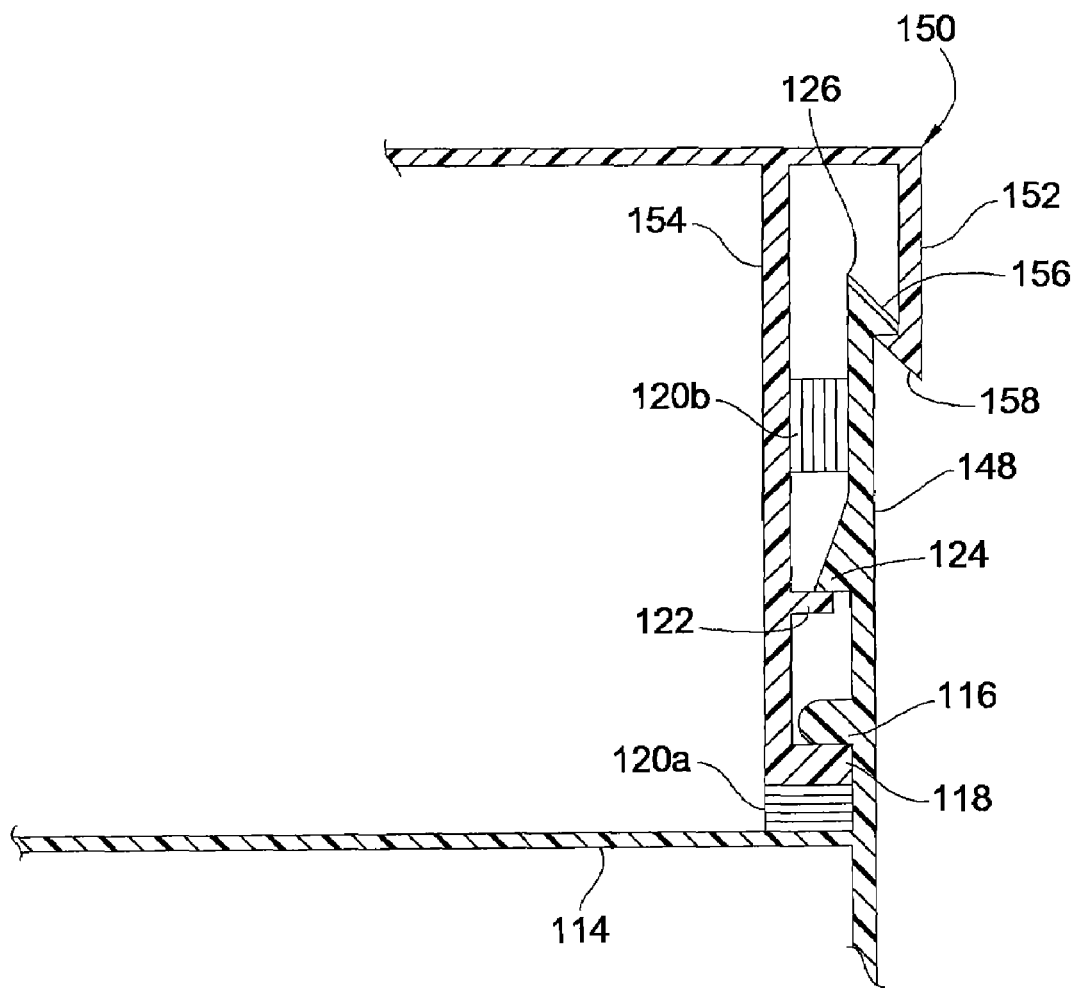
FIG. 13 is a sectioned elevation view of the threaded cover and housing, showing various embodiments for a sealing and a snap-fitting of the cover to the module housing.

Referring now to FIG. 13, in the threaded cover embodiment, a spring seal 120a (shown in cross-section), e.g., a plastic spring seal 120a, is provided either (i) integrally with grid 114 (located below threads 116/118, so as to seal between the top of grid 114 and the bottom edge of cover 150), (ii) integrally with cover 150 (located above threads 116/118 to seal between a bottom surface of cover 150 and edge 126 of collar 148) or (iii) as a separate component (as shown in FIG. 13, located for example below threads 116 so as to seal between top of grid 114 and bottom edge of cover 150). Seal 120a is compressed to maintain tension between cover 150 and housing 112 when the cover is threaded onto the housing, which tends to keep cover 150 from spinning loose from housing 112 due to vibrations during movement of the vehicle. The spring seal 120a also serves as a seal between cover 150 and housing 112, so as to protect the fuses, circuitry etc., from outside dust, moisture and other contaminants. Suitable materials for spring seal 120a include Teflon, nylon, neoprene, or silicone.

Seal 120b is located alternatively between collar 148 and an inner side 154 of cover 150 as seen in FIG. 13. Seal 120b can either be a separate piece or integral with cover 150 or collar 148. Seal 120b also tends to prevent cover 150 from loosening with respect to collar 148.

FIG. 13 also shows that cover includes one or more snap-fitting apparatus 122 that snaps over inwardly projecting lip 124 of collar 148 or base. Snap-fitting apparatus 122 locks beneath lip 124 extending inwardly from collar 148 when the cover is threaded onto the collar, to hold cover 150 onto housing 112 and prevent the cover from spinning loose from the collar. When cover 150 is threaded off of collar 148, snap-fitting apparatus 122 snaps up over lip 124 to allow the cover to be removed from housing 112. One or both of mating and locking apparatuses 122/124 do not extend all the way around the circle (apparatus 124 seen in FIG. 12B), such that after twisting cover 150 for a partial turn, the mating apparatuses 122/124 come free from each other, so that threads 118 of cover 150 can thread off of threads 116 of collar 148 of housing 112.

Alternatively or additionally, edge 126 of collar 148 includes one or more snap-fitting apparatus 156 that locks with a mating apparatus 158 located at the bottom of outer side 152 of cover 150. One or both of mating and locking apparatuses 156/158 do not extend all the way around the circle (apparatus 158 seen in FIG. 12B), such that after twisting cover 150 for a partial turn, the mating apparatuses 156/158 come free from each other, so that threads 118 of cover 150 can thread off of threads 116 of collar 148 of housing 112.

Figure 14:
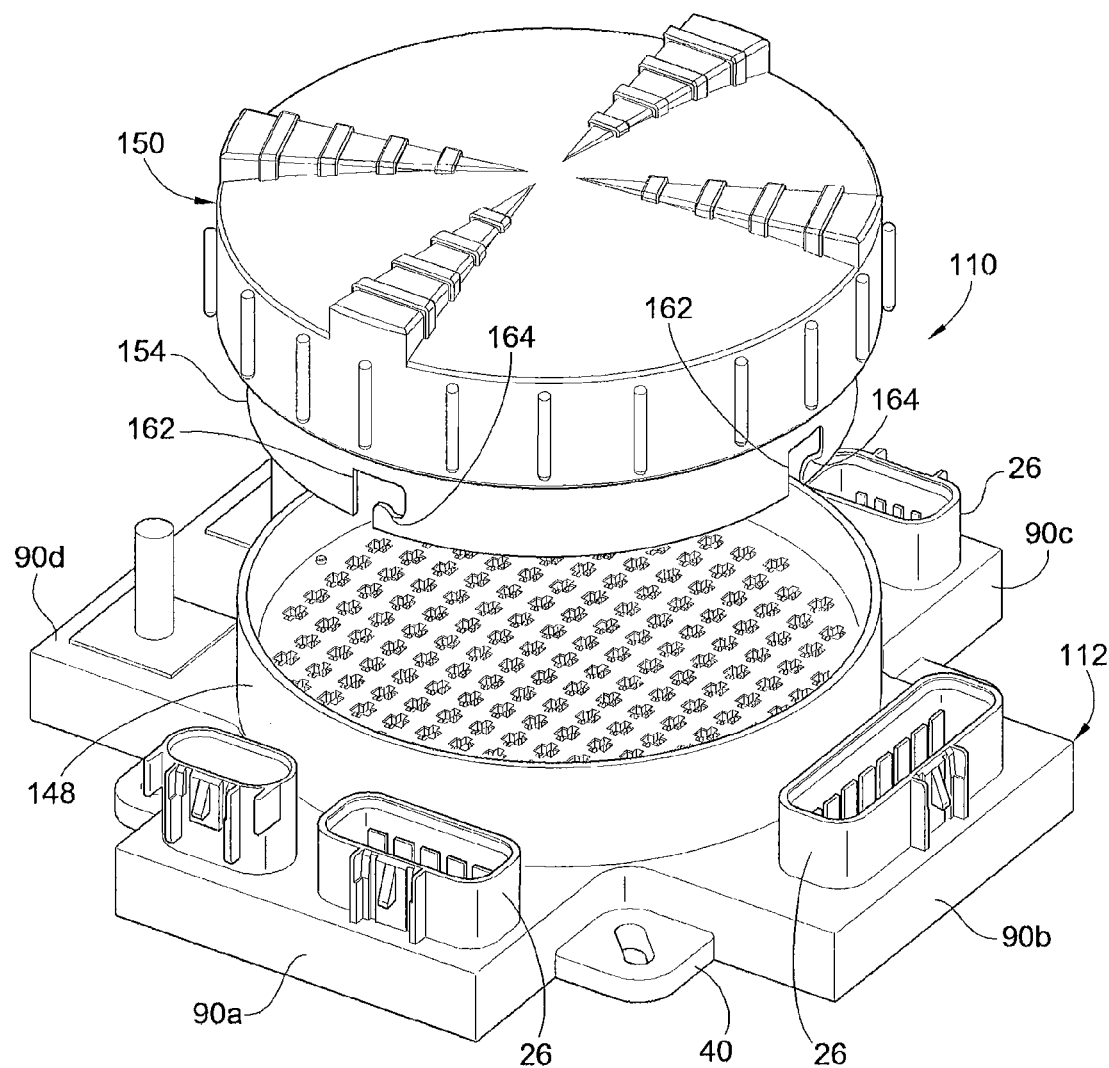
FIG. 14 is a perspective view of a power distribution module having a twist-on cover that is snap-fitted into place.

FIG. 14 illustrates an alternative embodiment for twisting cover 150 onto and off of housing 112 of module 110. Here, the lower/inner side 154 of cover 150 includes or defines right-angle apertures or cutouts 162 (e.g., four spaced evenly about side 154) that enables cover 150 to translate over pegs or features (not illustrated) that protrude outward from collar 148 of housing 112. Once cover 150 is fully translated onto collar 148 and over the pegs, the user rotates cover 150 a small amount (here in a clockwise direction), such that an upwardly protruding tip 164 of side 154 snap-fits around the underside of the peg to hold cover 150 releasably onto collar 148. When the user needs to remove cover 150 from housing 112, the user rotates the cover (here in a counterclockwise direction), such that upwardly protruding tip 164 of side 154 snaps back under the peg of collar 148, after which the user can translate cover 150 off of housing 112.

Figure 15:
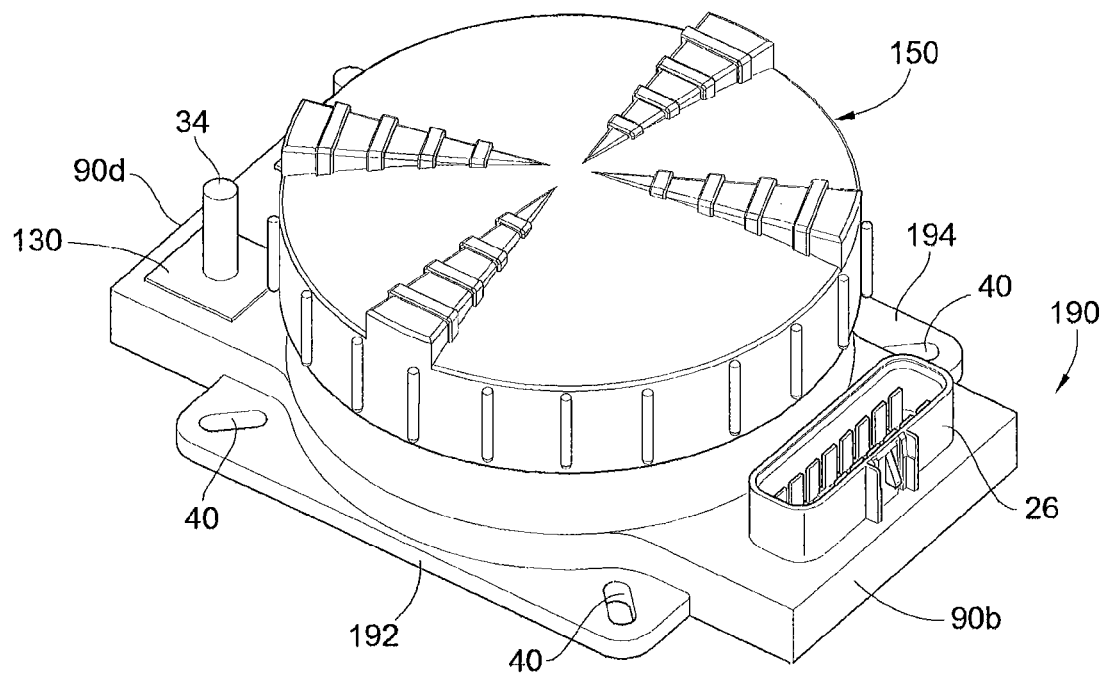
FIG. 15 is a perspective view of a two-leafed power distribution module.

Referring now to FIG. 15, an alternative feed-though power distribution module 190 includes only two leafs 90b and 90d. Leaf 90b includes a connector mount 26, while leaf 90d includes stud connectors 34. Leafs 90a and 90c have been replaced via the molding process discussed above with mounting flanges 192 and 194, each defining a pair of mounting apertures 40 (circular or slotted). In any configuration, however, the power distribution modules of the present disclosure each maintain the same spacing between mounting holes 40 (circular or slotted) in one embodiment.

Figure 16:
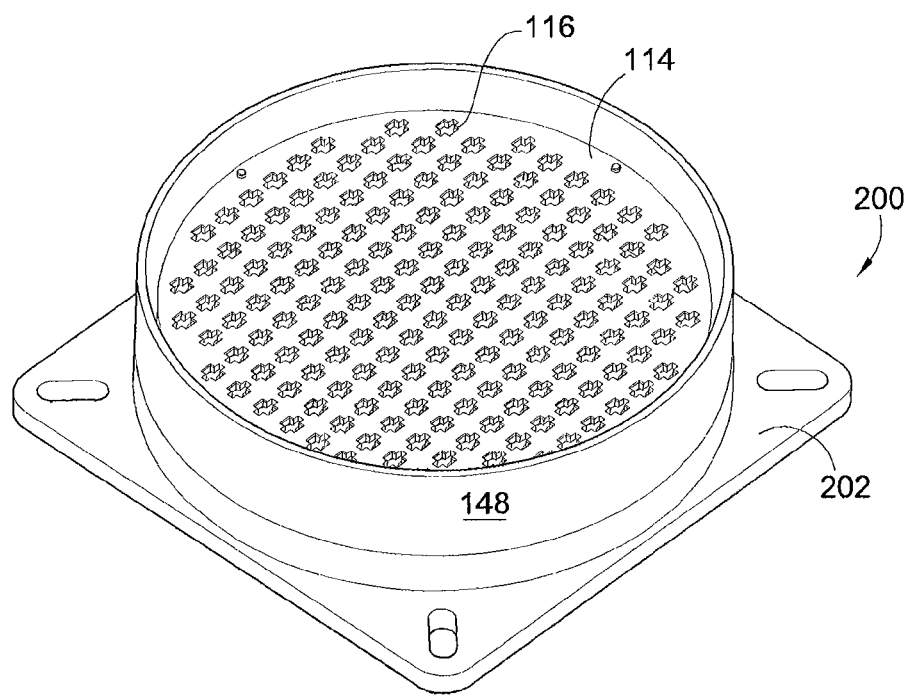
FIG. 16 is a perspective view of a no-leafed power distribution module.

Referring now to FIG. 16, an alternative feed-though power distribution module 200 includes no two leafs. Here, all four leafs 90a to 90d have been replaced via the molding process discussed above with a four-sided mounting flange 202 having four sides, each defining a pair of mounting apertures 40 (circular or slotted). In any configuration, however, the power distribution modules of the present disclosure each maintain the same spacing between mounting holes 40 (circular or slotted) in one embodiment.

Figure 17A:
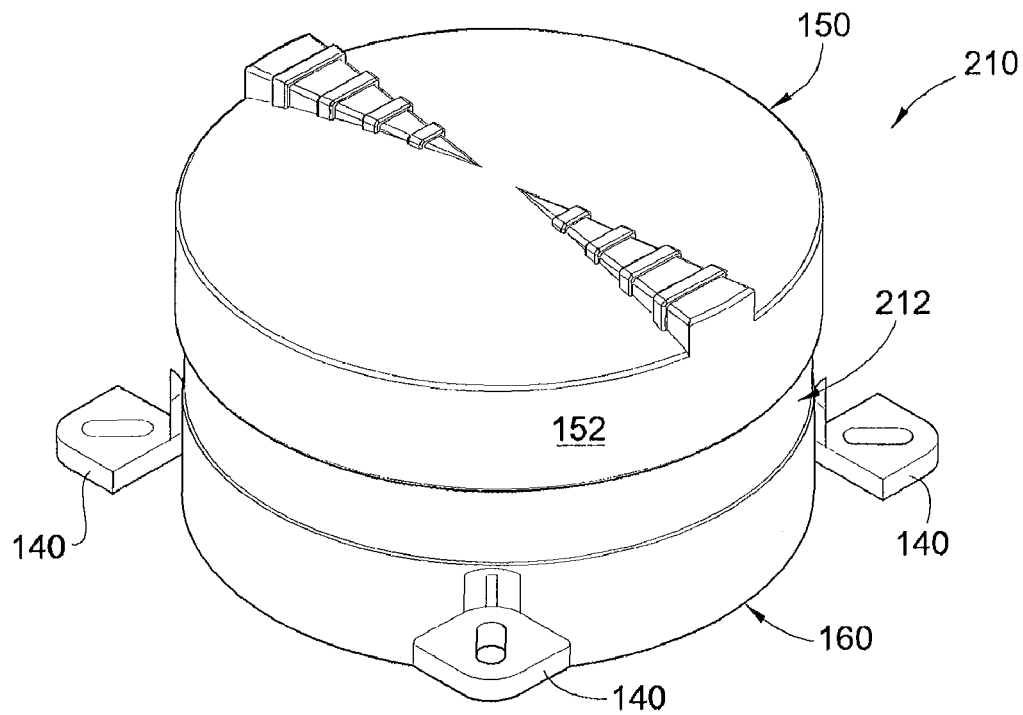
FIGS. 17A and 17B are perspective views of one embodiment of a feed-through power distribution module having a threaded cover and housing.
Figure 17B:
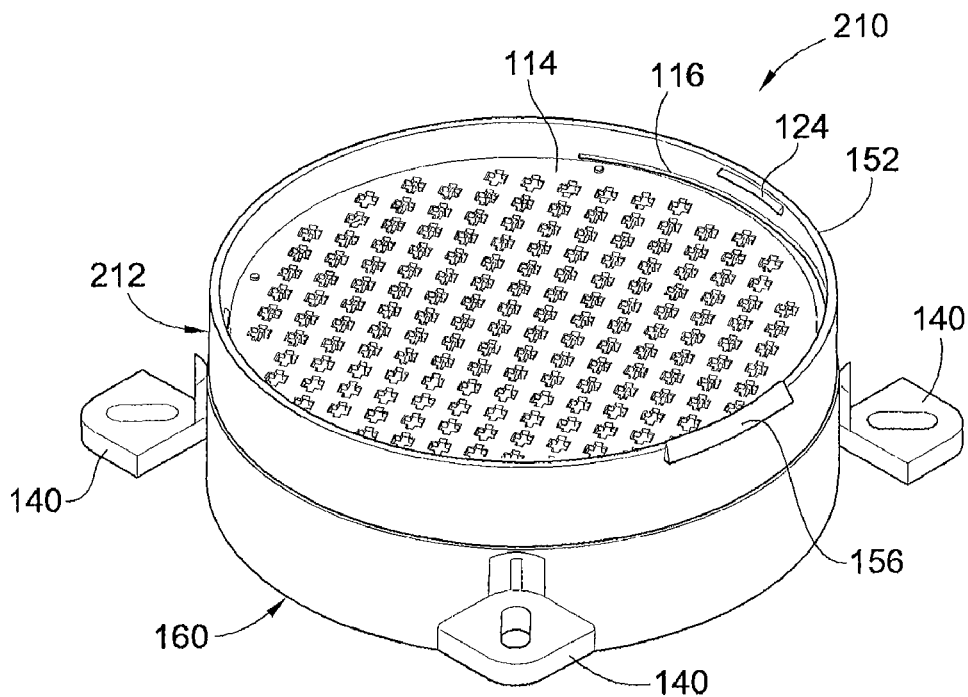
Figure 17C:
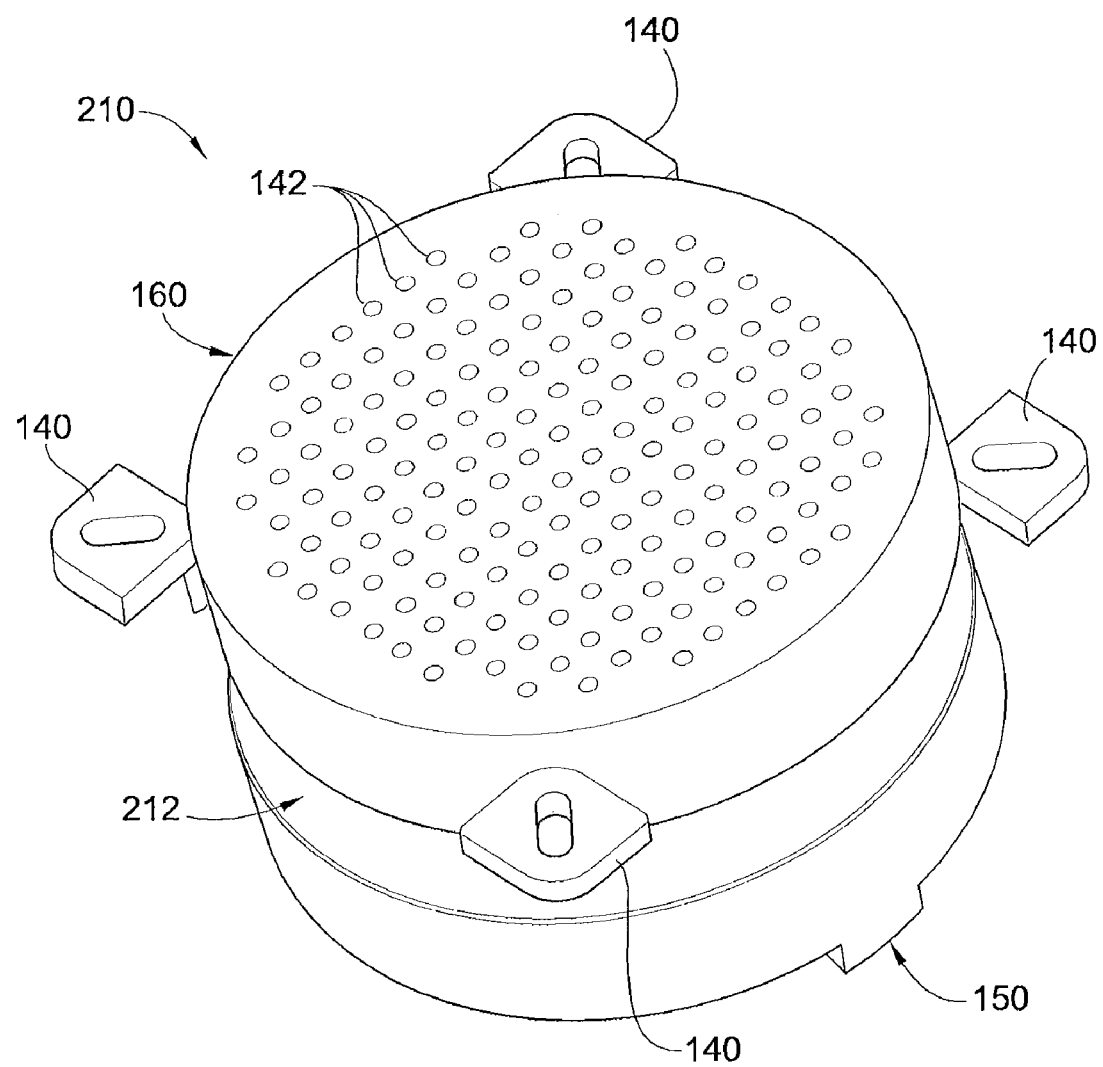
FIG. 17C is a perspective view of one embodiment of a feed-through power distribution module having a threaded cover and hard-wired base.
Figure 18A:
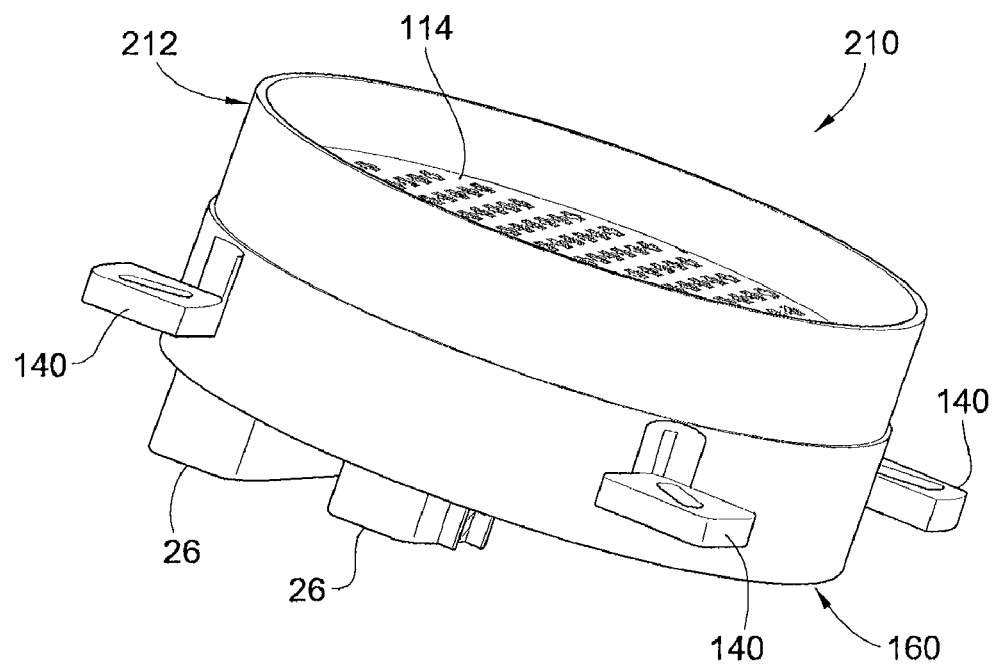
FIGS. 18A and 18B are perspective views of one embodiment of a feed-through power distribution module having a threaded cover and connector mount base.
Figure 18B:
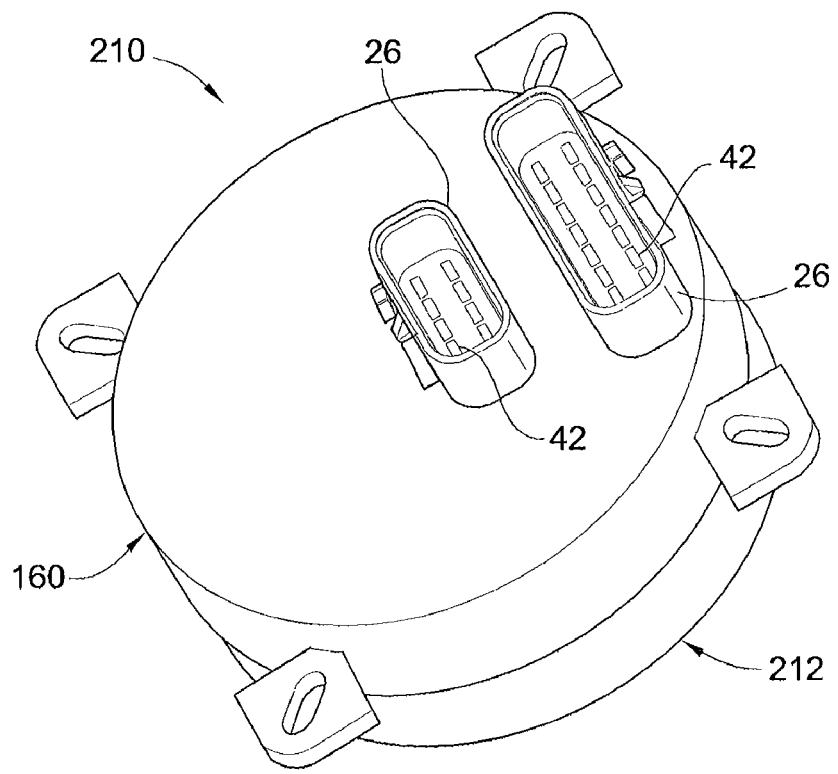

FIGS. 17A, 17B, 17C, 18A and 18B illustrate various embodiments of a feed-though power distribution module 210, which includes a round housing 212 that threadingly engages round cover 150 in the same manner as described above for power distribution module 110. Module 210 includes no leafs 90a to 90d as compared to modules 10 and 110 above. Also, alternative mounts 140 are fixed to feed-through base 160, which in the illustrated embodiments snaps onto housing 212. Because there are no leafs, the connector mounts are mounted to the base 160 (FIGS. 18A and 18B). Or, the module is hard-wired (FIG. 17C). Either configuration precludes the twisting of base 160 with respect to housing 212. Housing 212 could be provided alternatively with connector carrying leafs, in which case base 160 could thread onto and off of housing 212.

Mounts 140 have the same mounting footprint as mounting holes 40 in one embodiment, so that power distribution module 210 can readily replace or be replaced by modules 10 or 110. FIG. 17B with cover 150 removed shows that housing 212 forms the same circular component grid 114 as does housing 112 of module 110. One or both of locking apparatuses 124 and 156 can be provided with housing 212 and lock to cover 150 as discussed above with module 110.

FIG. 17C shows one way to connect wires to module 210. Here, individual wires are fed through wire holes 142 in base 160. The wires each terminate with a terminal that crimps onto the wire which mates to a female terminal, such as terminal K or L shown in FIG. 2, located on the opposite side of a PCB or plastic substrate from the fuse holding tuning-fork terminals M and N of fuse terminals 72. Terminals K or L are used in lieu of the connector terminals 42. Here, board traces are not always needed, so the PCB can be replaced with a plastic terminal mount if desired. Base 160 snap-fits to housing 212 and translates off of the housing, sliding along the wires extending through wire holes 142 in base 160 to assemble or repair module 210.

FIGS. 18A and 18B show an alternative embodiment in which connector mounts 26 are molded onto base 160. A PCB is located within housing 212, with fuse terminals 72 (here as shown in FIGS. 10 and 11 without wire terminals K and L) extending in one direction towards grid 114 and connector terminals 78 extending in the opposite direction though connector terminal apertures 42 located inside of the connector mounts 26. Internal traces or conductive vias in the PCB connect fuse terminals 72 with connector terminals 78. Base 160 again snap-fits onto and translates off of housing 212 because base 160 cannot be turned relative to the housing with the connector terminals 78 extending from the PCB through the apertures 42 of the connector mounts 26 located on base 160. Cover 150 can thread over the fuses on grid 114 side of housing 212 however. A rectangular version of the power distribution module of FIGS. 18A and 18B can be provided alternatively. In any configuration, however, the power distribution modules of the present disclosure each maintain the same spacing between mounting holes 40 (circular or slotted) in one embodiment.

Figure 19:
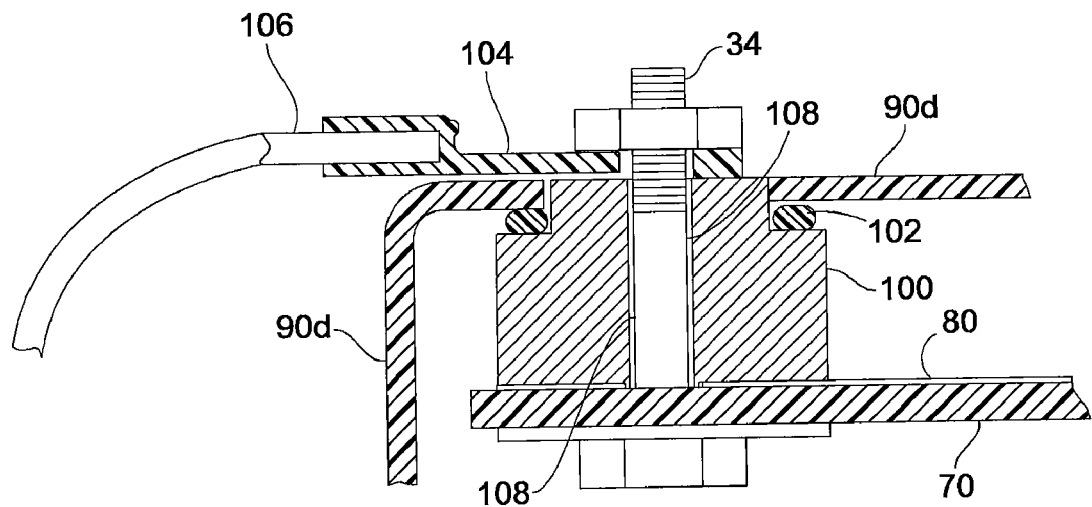
FIG. 19 is a sectioned elevation view of one embodiment for sealing around a stud connector.

Referring now to FIG. 19, one embodiment for sealing stud connector 34 is illustrated. Stud connectors 34 as seen for example in FIGS. 3, 4, 5 and 7 are connected to leaf 90*d* of housing 12 of module 10. Stud connectors 34 can also be provided with the threaded cover module 110. It is important to seal the inside of the modules from the outside environment, which could be near an operating vehicle engine. FIG. 19 includes a conductive block 100, e.g., copper, which is connected electrically with one or more trace 80 located on PCB 70. Conductive block 100 seals to leaf 90*d* of housing 12 via an o-ring seal 102, which can be teflon, nylon, silicone, Santoprene or neoprene for example. Conductive block 100 is also connected electrically to a ring terminal 104, which crimps a cable 106, such as a battery cable. Ring terminal 104 is replaced alternatively with the terminal of a larger rated fuse, such as a MEGA® and MIDI® fuse provided by the assignee of the present disclosure. A seal, such as an epoxy or glue-type seal 108, seals between stud 34 and conductive block 100. One suitable epoxy sealant is Loctite® sealant. Seal 108 is alternatively a plastic or rubber sleeve that is compressed between stud 34 and conductive block 100. Stud can also be insert-molded into housing to create a sealed installation.

Figure 20:
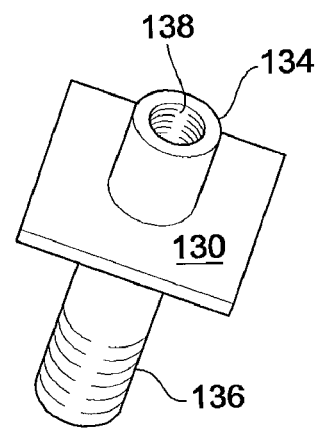
FIG. 20 is a perspective view of one embodiment for a stud connector.

Referring now to FIG. 20, an alternative connector mounting stud 134 is illustrated. Stud 134 can replace any of the studs 34 shown herein and connect any of the apparatuses described herein for stud 34. Connector mounting stud 134 connects to a stud flange 130, which is shown for example in FIG. 15 sealing or mounting to (or being part of leaf 90*d* of housing 112. Connector mounting stud 134 includes external male threads 136 on one end and female threads 138 on the other end. Female threads 138 accept mating male threads of a component stud or a screw for fastening a component to stud 134. the female threaded end can extend in either direction from the module housing.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A power distribution module for a vehicle comprising:
    an insulating housing including a collar and a component grid, the component grid defining a plurality of fuse footprints;
    a printed circuit board ("PCB") located within the housing and beneath the component grid, the PCB holding a plurality of fuse mounting terminals and at least one connector mounting terminal, the PCB including a plurality of conducting traces connecting the fuse mounting terminals to the at least one connector mounting terminal;
    a cover configured to translate over the component grid, said cover having a ridge portion; and
    a snap fitting apparatus extending from said collar having a protrusion portion that when said cover is twist-locked to the housing, the ridge portion of the cover engages the protrusion portion of the snap fitting apparatus to prevent the cover from loosening from the housing.

2. The power distribution module of claim 1, the housing further including at least one connector mount, the plurality of fuse mounting terminals aligning with the plurality of fuse footprints, the at least one connector mounting terminal aligning with the at least one connector mount of the housing.

3. The power distribution module of claim 1, the plurality of fuse footprints including at least two different footprints for at least two different types of fuses.

4. The power distribution module of claim 1, wherein the fuse mounting terminals and the at least one connector mounting terminal are at least one of: (i) through-hole mounted to the PCB; (ii) surface mounted to the PCB; (iii) mechanically held to the PCB and (iv) soldered to the PCB.

5. The power distribution module of claim 1, which includes at least one overvoltage protection device connected to the PCB and in electrical communication with the at least one connector mounting terminal.

6. The power distribution module of claim 1, which includes at least one light emitting diode connected to the PCB and in electrical communication with at least one of the fuse mounting terminals to provide open fuse indication.

7. The power distribution module of claim 1, which includes at least one light emitting diode positioned to illuminate fuses mounted in the component grid when the cover is removed from the housing.

8. The power distribution module of claim 1, the housing including at least one of: (i) a plurality of connector mounts, the component grid located between the plurality of connector mounts; (ii) at least two different types of connector mounts; and (iii) apparatus configured to hold stud connectors to which higher rated fuses or cables can be mounted.

9. The power distribution module of claim 1, which includes a spring seal between the housing and the cover, the spring seal sealing the housing to the cover and providing a force tending to prevent the cover from loosening from the housing when the vehicle is being driven.

10. A power distribution module for a vehicle comprising:
    an insulating housing including a component grid, the component grid defining a plurality of fuse footprints, the housing further including a collar having a snap fitting apparatus extending from said collar defining a protrusion portion;
    a printed circuit board ("PCB") located within the housing and beneath the component grid, the PCB holding a plurality of fuse mounting terminals and at least one connector mounting terminal, the PCB including a plurality of conducting traces connecting the fuse mounting terminals to the at least one connector mounting terminal; and
    a cover having a ridge portion that when said cover is twist-locked to the housing, the ridge portion of the cover engages the protrusion portion of the collar to prevent the cover from loosening from the housing.

11. A power distribution module for a vehicle comprising:
    an insulating housing including a component grid, the component grid defining a plurality of fuse footprints, the housing further including at least one connector mount;
    a printed circuit board ("PCB") located within the housing and beneath the component grid, the PCB holding a plurality of fuse mounting terminals and at least one connector mounting terminal, the PCB further including a plurality of conducting traces connecting the fuse mounting terminals to the at least one connector mounting terminal;

a conductive stud mount connected electrically to at least one of the traces of the PCB, the conductive stud mount in sealed communication with the housing; and a conductive block electrically connected to at least one of the traces of the PCB and the at least one connector mount.

12. The power distribution module of claim 11, wherein the conductive stud mount is fixed to the PCB.

13. The power distribution module of claim 11, the conductive stud mount including a surface through which an aperture is formed, a stud fitted through the aperture and sealed to the surface.

* * * * *